(12) United States Patent
Hsu et al.

(10) Patent No.: US 12,516,032 B2
(45) Date of Patent: Jan. 6, 2026

(54) EPOXY COMPOUND, COMPOSITION AND CURED PRODUCT THEREOF

(71) Applicant: INDUSTRIAL TECHNOLOGY RESEARCH INSTITUTE, Hsinchu (TW)

(72) Inventors: Meei-Yu Hsu, Hsinchu (TW); Chih-Hao Lin, Taoyuan (TW); Kai-Chi Chen, Zhubei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 610 days.

(21) Appl. No.: 18/147,429

(22) Filed: Dec. 28, 2022

(65) Prior Publication Data

US 2023/0234933 A1  Jul. 27, 2023

Related U.S. Application Data

(60) Provisional application No. 63/302,281, filed on Jan. 24, 2022.

(30) Foreign Application Priority Data

Nov. 21, 2022 (TW) .................................. 111144353

(51) Int. Cl.
   C07D 303/30 (2006.01)
   C07D 303/34 (2006.01)
   C08G 59/32 (2006.01)

(52) U.S. Cl.
   CPC ......... C07D 303/30 (2013.01); C07D 303/34 (2013.01); C08G 59/3227 (2013.01); C08G 59/3263 (2013.01)

(58) Field of Classification Search
   CPC .............. C07D 303/30; C07D 303/34; C08G 59/3227; C08G 59/3263
   See application file for complete search history.

(56) References Cited

U.S. PATENT DOCUMENTS

| | | | |
|---|---|---|---|
| 5,358,980 A | 10/1994 | Shiobara et al. | |
| 6,261,481 B1 | 7/2001 | Akatsuka et al. | |
| 11,186,776 B2 | 11/2021 | Lim et al. | |
| 2005/0090673 A1 | 4/2005 | Pews | |
| 2014/0231122 A1 | 8/2014 | Park et al. | |
| 2018/0201835 A1* | 7/2018 | Goh .................... | C09K 19/322 |
| 2018/0298186 A1 | 10/2018 | Yoshihara et al. | |
| 2019/0338068 A1 | 11/2019 | Maruyama et al. | |

(Continued)

FOREIGN PATENT DOCUMENTS

CN   103382284 B   3/2018
CN   108409689 A   8/2018

(Continued)

OTHER PUBLICATIONS

Taiwanese Office Action and Search Report for corresponding Taiwanese Application No. 111144353, dated Aug. 21, 2023.

(Continued)

*Primary Examiner* — Mark Eashoo
*Assistant Examiner* — Caitlin Norine Illing
(74) *Attorney, Agent, or Firm* — Birch, Stewart, Kolasch & Birch, LLP

(57) ABSTRACT

An epoxy compound, composition and cured product thereof are provided. The epoxy compound has a structure represented by Formula (I)

Formula (I)

wherein $R^1$ and $R^2$ are each independently cyano group, isocyanate group, oxiranyl, methyloxiranyl group, glycidyl group, methylglycidyl group, epoxypropyl group, oxetanyl group, oxetanemethyl group, or $C_1$-$C_{10}$ alkoxy group; Z is —O—, $R^3$ and $R^4$ are each independently hydrogen, fluorine, methyl, fluoromethyl, or ethyl; n and m are each independently 3, 4, 5, 6, 7, 8, 9, or 10; and i and j are each independently 1, 2, or 3.

10 Claims, No Drawings

(56) References Cited

U.S. PATENT DOCUMENTS

2021/0054136 A1 2/2021 Katagi et al.
2021/0246372 A1 8/2021 Gu et al.
2022/0049046 A1 2/2022 Maruyama et al.

FOREIGN PATENT DOCUMENTS

| CN | 109843967 A | 6/2019 |
| CN | 109890866 A | 6/2019 |
| CN | 113234042 A | 8/2021 |
| CN | 113248716 A | 8/2021 |
| CN | 113728030 A | 11/2021 |
| JP | 2005-206814 A | 8/2005 |
| JP | WO2018/016615 A1 | 1/2018 |
| TW | 201930453 A | 8/2019 |
| TW | 202138463 A1 | 10/2021 |
| WO | WO 2021/140081 A1 | 7/2021 |

OTHER PUBLICATIONS

Islam et al., "Enhanced Thermal Conductivity of Liquid Crystalline Epoxy Resin using Controlled Linear Polymerization," ACS Macro Letters, vol. 7, 2018, pp. 1180-1185.

Ruan et al., "Liquid crystal epoxy resins with high intrinsic thermal conductivities and their composites: A mini-review," Elsevier, Materials Today Physics, vol. 20, 100456, 2021, pp. 1-12.

Yang et al., "High-efficiency improvement of thermal conductivities for epoxy composites from synthesized liquid crystal epoxy followed by doping BN fillers," Elsevier, Composites Part B, vol. 185, 107784, 2020, pp. 1-8.

Taiwanese Notice of Allowance and Search Report for Taiwanese Application No. 112144891, dated Nov. 14, 2024.

* cited by examiner

EPOXY COMPOUND, COMPOSITION AND CURED PRODUCT THEREOF

CROSS REFERENCE TO RELATED APPLICATIONS

This application claims priority to U.S. Provisional Application Ser. No. 63/302,281, filed on Jan. 24, 2022, the entirety of which is incorporated by reference herein. Further, the application claims priority of Taiwan Patent Application No. 111144353, filed on Nov. 21, 2022, the entirety of which is incorporated by reference herein.

TECHNICAL FIELD

The disclosure relates to an epoxy compound, a composition, and a cured product thereof.

BACKGROUND

Epoxy resins are widely used in optoelectronic and semiconductor components. Epoxy resins are a preferred insulating material due to their excellent mechanical properties and great thermal tolerance. Due to the rapid development of high-voltage high power modules, the excessive accumulation of heat will accelerate the aging of epoxy resin, damage its internal basic structure, and affect its stability, resulting in a shortened lifespan for any devices that contain an epoxy resin.

In order to improve the thermal conductivity of a composition containing a conventional low thermal conductivity epoxy resin, a large amount of thermal conductivity powder is generally mixed with conventional epoxy resin to serve as a packaging material for high thermal conductivity. However, the addition of thermal conductive powder will affect the fluidity of the composition and the mechanical properties of the packaging material, thereby limiting the amount of thermal conductive powder that can be added. Therefore, it is unable to meet the requirements on high heat conduction modules.

Epoxy resins with mesogen structures have been used in epoxy resin composition to form insulating materials with excellent thermal conductivity. However, conventional epoxy resins with mesogen structures have a relatively high melting point (higher than 120° C.), and also has a high viscosity in the melting state. Therefore, when melt-blending with curing agent and filler, the conventional epoxy resins are not easy to disperse evenly, resulting in that the conventional epoxy resins cannot be applied to serve as solvent-free liquid packaging materials.

Accordingly, a novel epoxy resin composition is urgently desired to overcome the problems mentioned above.

SUMMARY

According to embodiments of the disclosure, the disclosure provides a method for According to embodiments of the disclosure, the disclosure provides an epoxy compound. The epoxy compound having a structure represented by Formula (I)

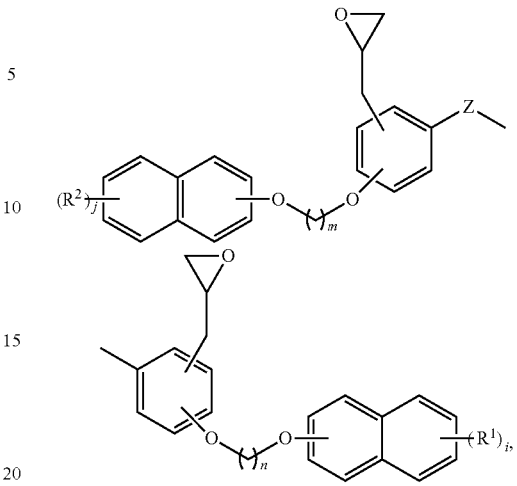

Formula (I)

wherein $R^1$ and $R^2$ are each independently cyano group, isocyanate group, oxiranyl group, methyloxiranyl group, glycidyl group, methylglycidyl group, epoxypropyl group, oxetanyl group, oxetanemethyl group, or $C_1$-$C_{10}$ alkoxy group; Z is —O—,

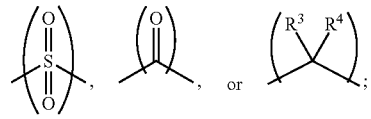

$R^3$ and $R^4$ are each independently hydrogen, fluorine, methyl, fluoromethyl, or ethyl; n and m are independently 3, 4, 5, 6, 7, 8, 9, or 10; and i and j are independently 1, 2, or 3.

According to embodiments of the disclosure, the disclosure provides a composition. The composition includes the epoxy compound of the disclosure and a curing agent, wherein the weight ratio of the epoxy compound to the curing agent is 1:9 to 9:1.

According to embodiments of the disclosure, the disclosure also provides a cured product. The cured product is a product of the composition of the disclosure via curing.

A detailed description is given in the following embodiments.

DETAILED DESCRIPTION

The epoxy compound, composition and the cured product thereof are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. As used herein, the term "about" in quantitative terms refers to plus or minus an amount that is general and reasonable to persons skilled in the art.

The disclosure provides an epoxy compound. Due to the introduction of the group with a mesogen structure into the side chain of the epoxy compound, an orderly arrangement of microstructures is achieved via the π-π stacking among the aromatic moieties when the epoxy compound reacts with a curing agent. As a result, the obtained cured product has a crystal-like structure, thereby increasing the thermal conductivity thereof.

In addition, since the melting point of the epoxy compound can be reduced and the physical properties of the epoxy compound can be adjusted by introducing the aliphatic chain thereinto, the epoxy compound of the disclosure has a lower viscosity when heated (at a temperature less than 90° C.). As a result, due to the great fluidity of epoxy compound, the epoxy compound of the disclosure can be suitable for use in concert with the curing agent to form a composition, which is suitable to serve as a solvent-free liquid packaging materials.

According to embodiments of the disclosure, the epoxy compound of the disclosure may have a structure represented by Formula (I)

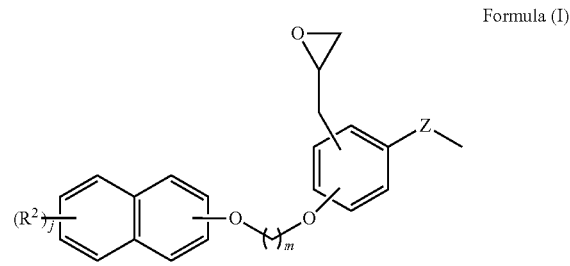

Formula (I)

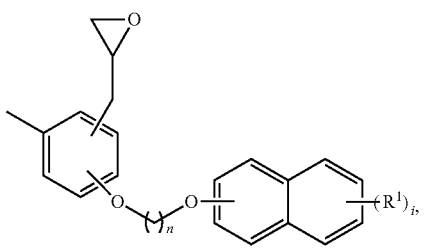

wherein $R^1$ and $R^2$ may be each independently cyano group, isocyanate group, oxiranyl group, methyloxiranyl group, glycidyl group, methylglycidyl group, epoxypropyl group, oxetanyl group, oxetanemethyl group, or $C_1$-$C_{10}$ alkoxy group; Z may be —O—,

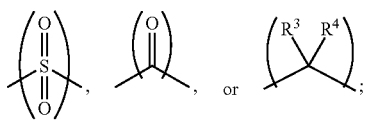

$R^3$ and $R^4$ may be each independently hydrogen, fluorine, methyl, fluoromethyl, or ethyl; n and m may be each independently 3, 4, 5, 6, 7, 8, 9, or 10; and i and j may be each independently 1, 2, or 3.

According to embodiments of the disclosure, the epoxy compound may be

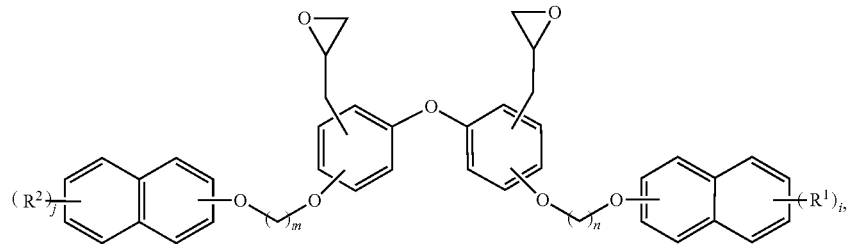

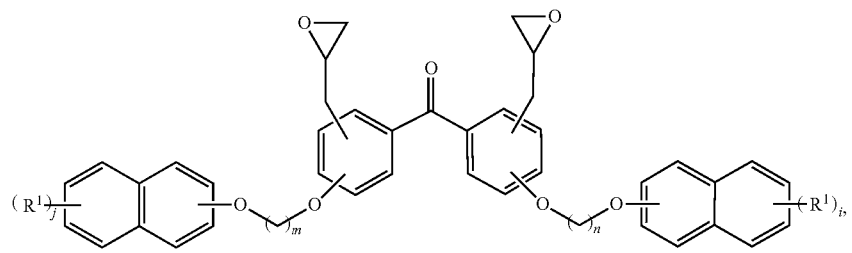

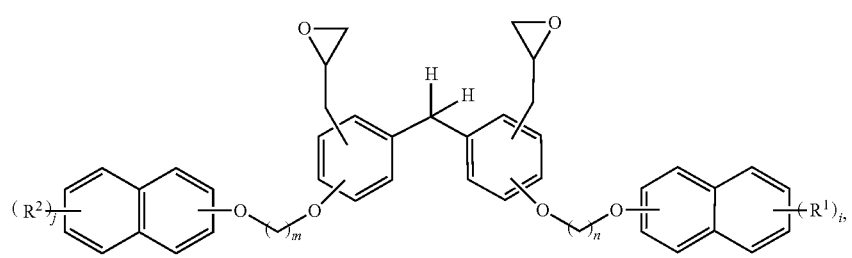

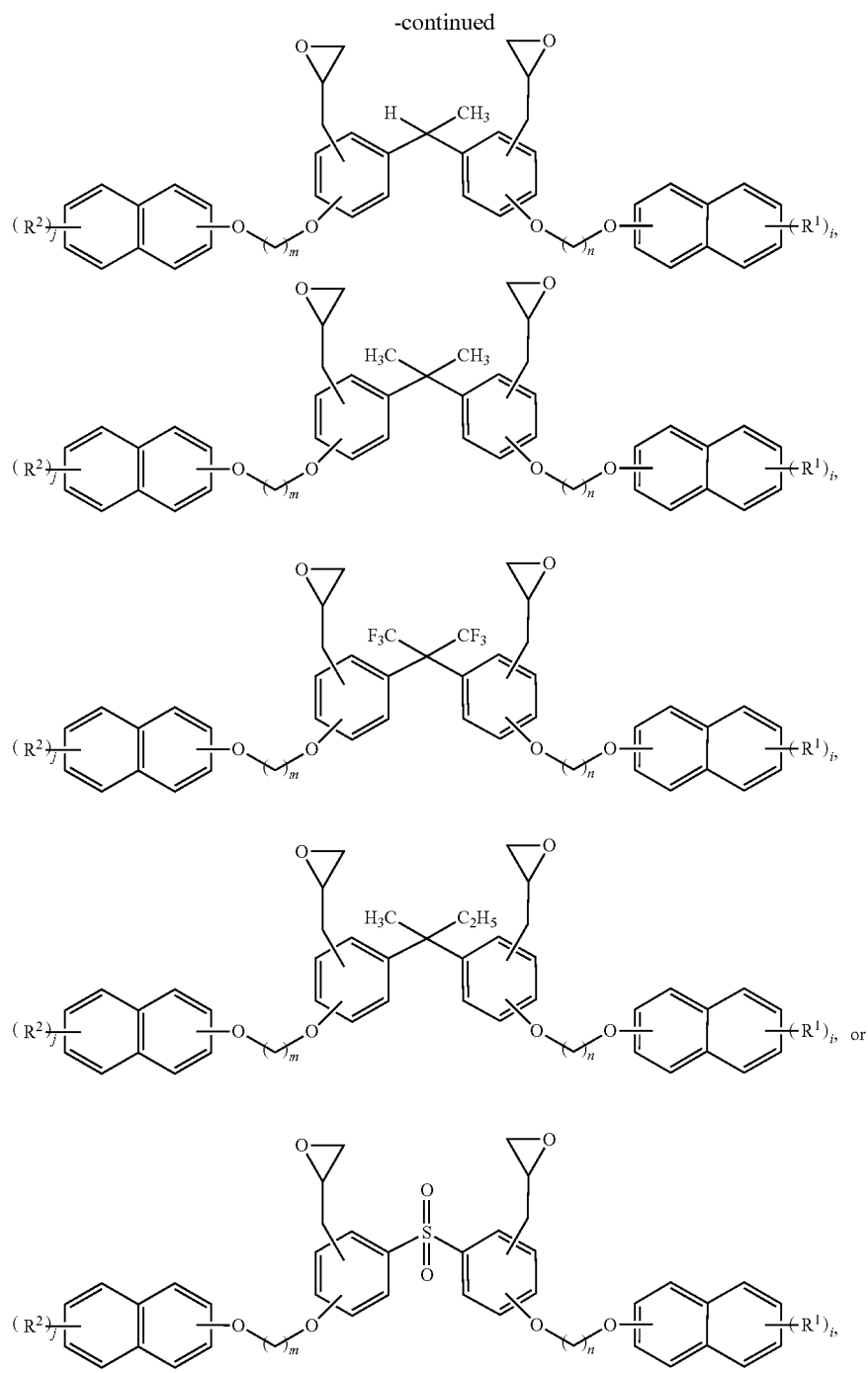

wherein $R^1$ and $R^2$ may be each independently cyano group, isocyanate group, oxiranyl group, methyloxiranyl group, glycidyl group, methylglycidyl group, epoxypropyl group, oxetanyl group, oxetanemethyl group, or $C_1$-$C_{10}$ alkoxy group; and n and m may be each independently 3, 4, 5, 6, 7, 8, 9, or 10; and i and j may be each independently 1, 2, or 3.

According to embodiments of the disclosure, $C_1$-$C_{10}$ alkoxy group may be linear or branched alkoxy group. For example, $C_1$-$C_{10}$ alkoxy group may be methoxy group, ethoxy group, propoxy group, butoxy group, pentoxy group, hexoxy group, or an isomer thereof.

According to embodiments of the disclosure, when n and m are independently 1 or 2, the epoxy compound has a higher melting point (higher than 90° C.) (i.e. having a higher viscosity under molten state) in comparison with the epoxy compound of the disclosure (which has n and m equal to or greater than 3) due to the shorter intramolecular aliphatic chain of the epoxy compound. As a result, due to the poor fluidity, the composition including the epoxy compound should be used in concert with a solvent to meet the processability requirements. Therefore, the epoxy compound is not suitable to serve as a solvent-free liquid packaging material.

According to embodiments of the disclosure, the epoxy compound may be

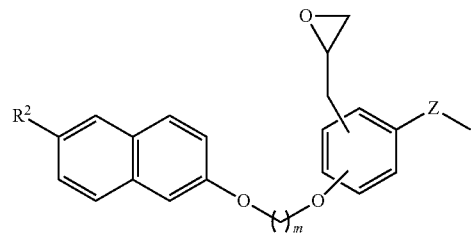

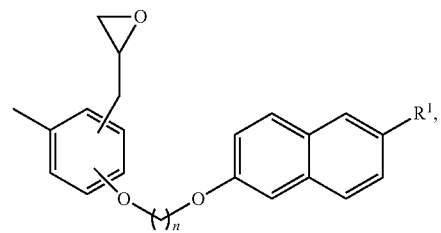

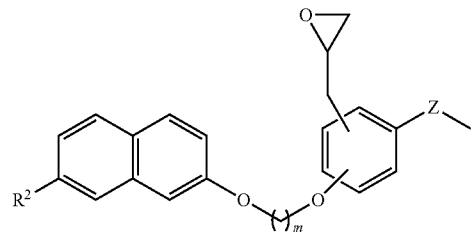

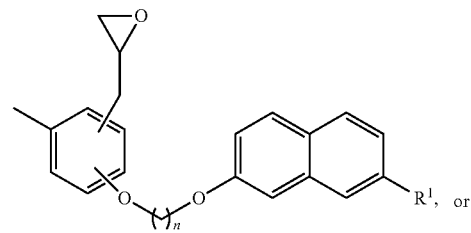 or

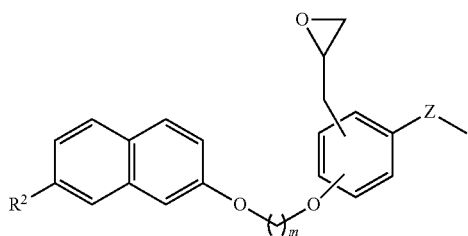

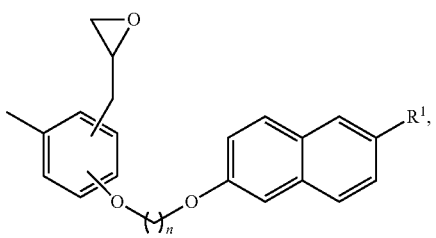

wherein $R^1$ and $R^2$ are each independently cyano group, isocyanate group, oxiranyl group, methyloxiranyl group, glycidyl group, methylglycidyl group, epoxypropyl group, oxetanyl group, oxetanemethyl group, or $C_1$-$C_{10}$ alkoxy group; Z may be —O—,

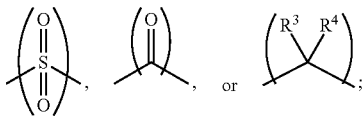

$R^3$ and $R^4$ may be each independently hydrogen, fluorine, methyl, fluoromethyl, or ethyl; and n and m may be each independently 3, 4, 5, 6, 7, 8, 9, or 10.

According to embodiments of the disclosure, the epoxy compound may be

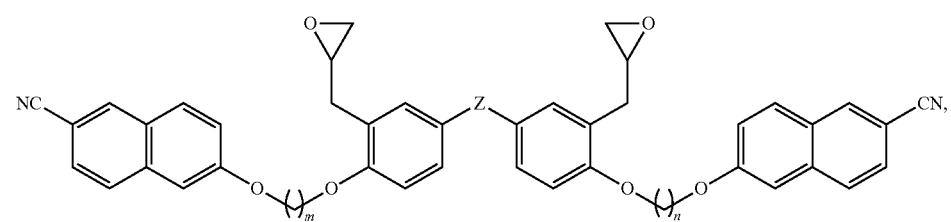

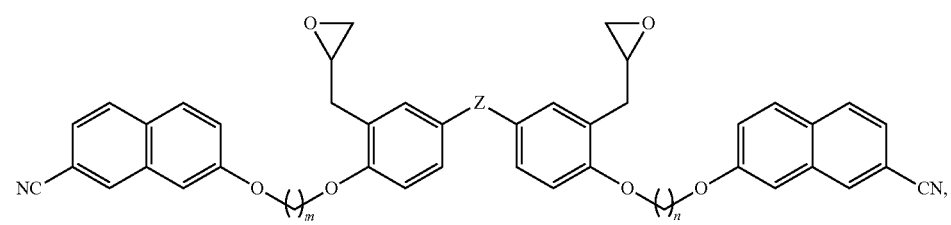

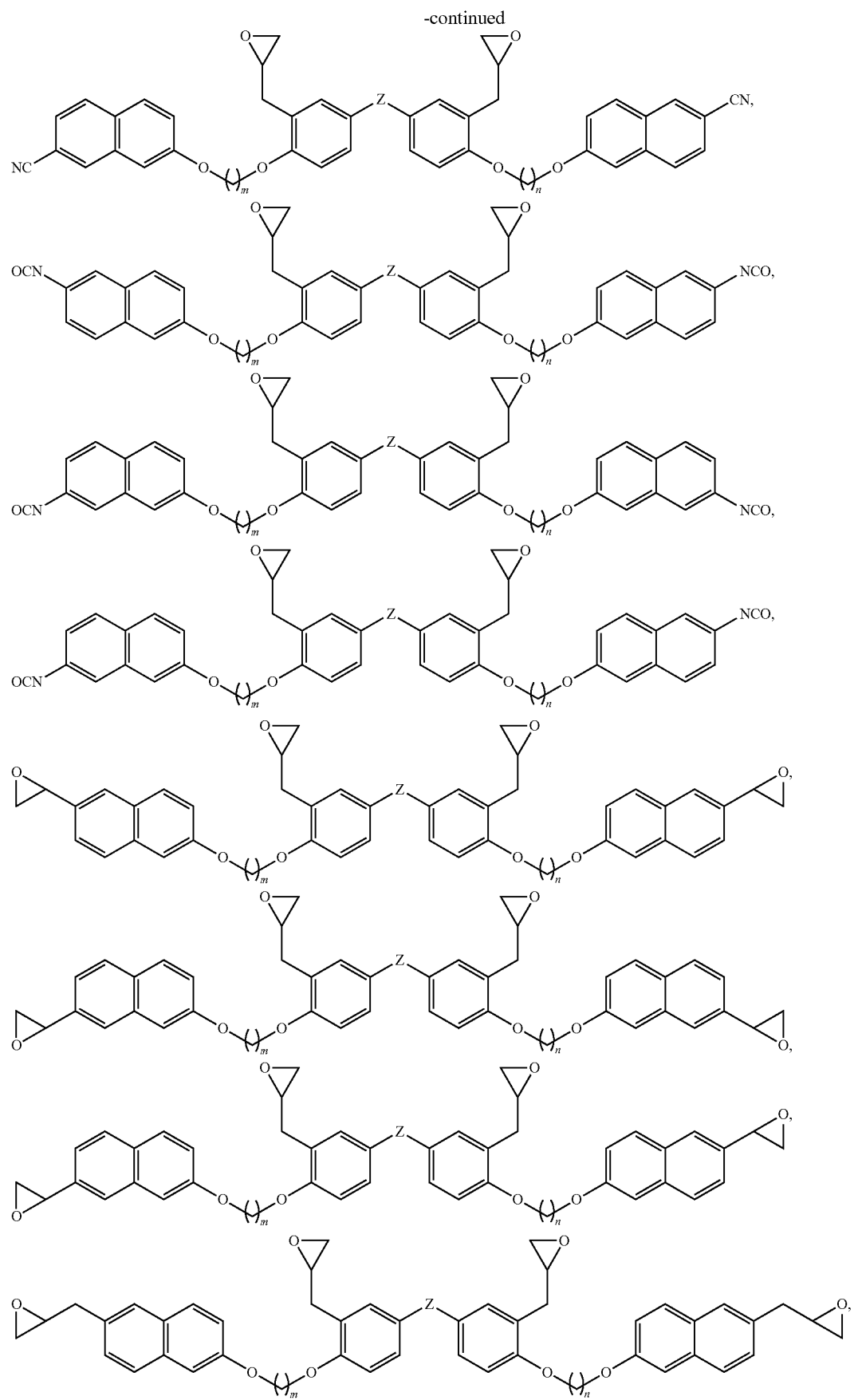

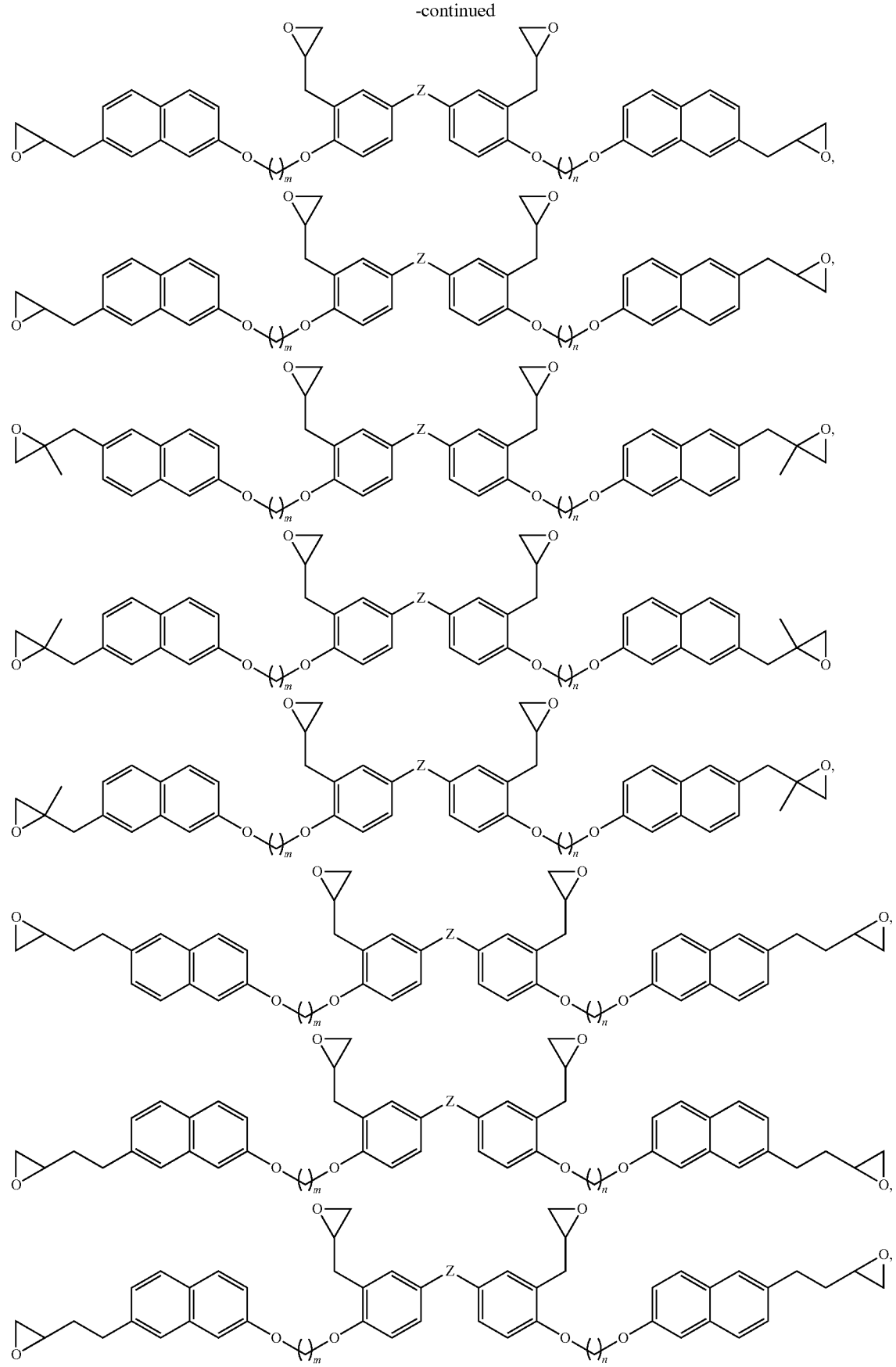

-continued
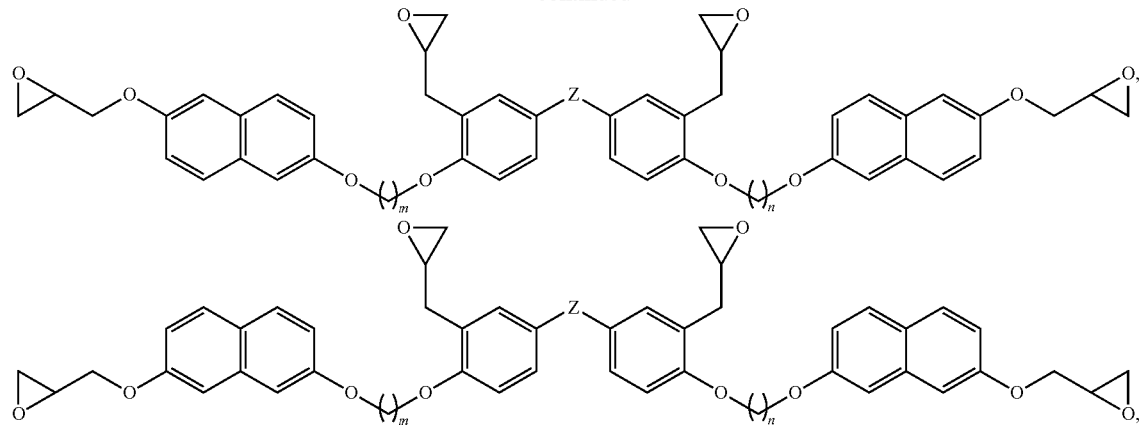
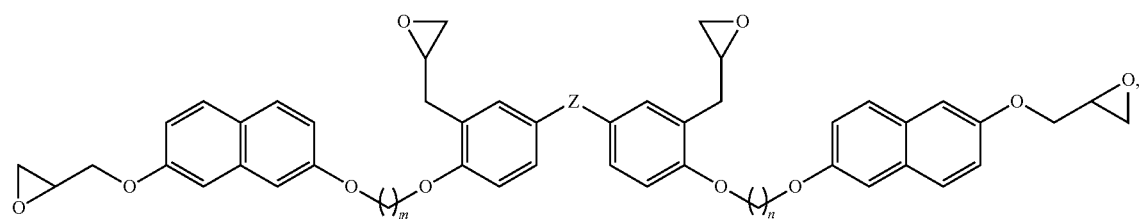
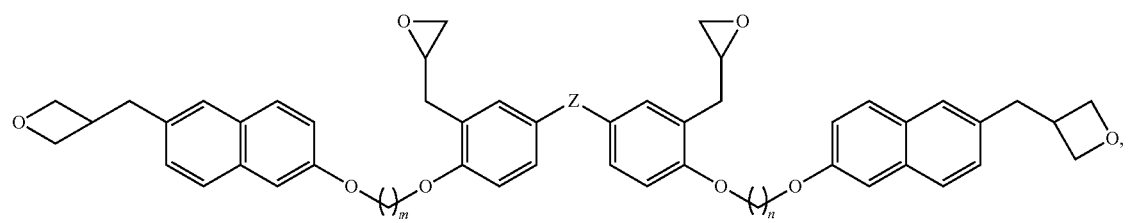
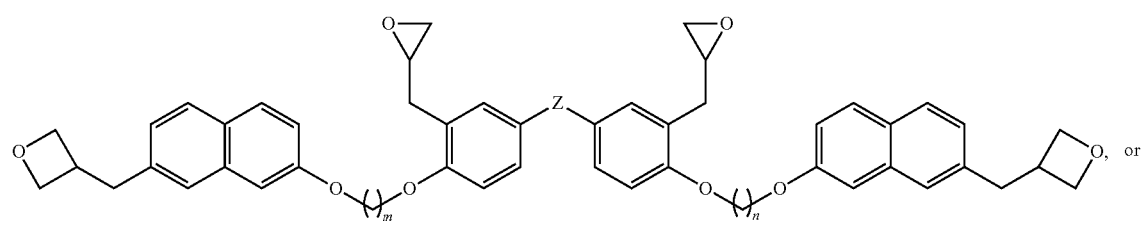, or
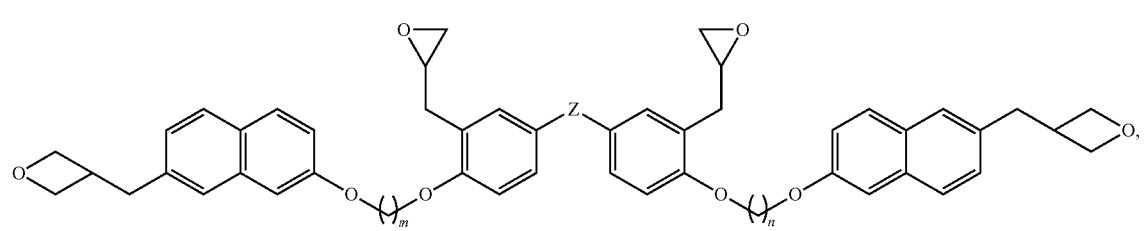

wherein Z may be —O—,
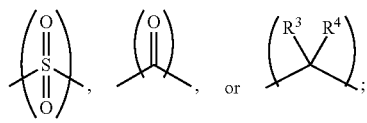
$R^3$ and $R^4$ may be each independently hydrogen, fluorine, methyl, fluoromethyl, or ethyl; and n and m may be each independently 3, 4, 5, 6, 7, 8, 9, or 10.
According to embodiments of the disclosure, the epoxy compound may be
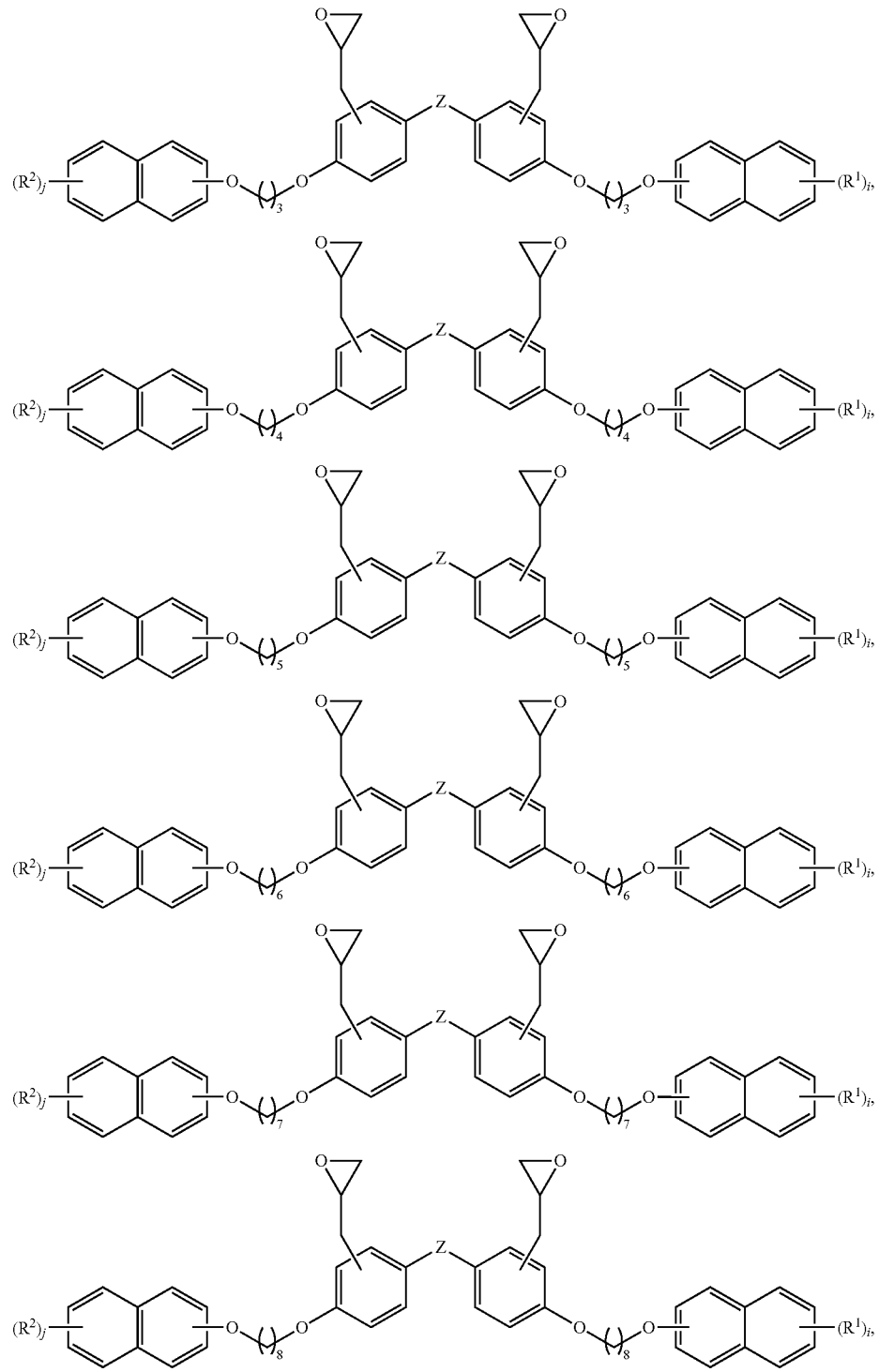

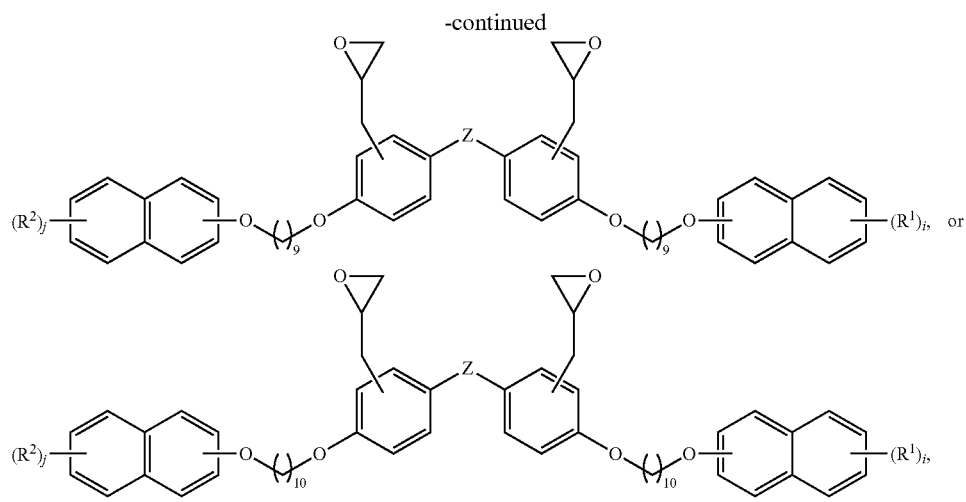

wherein $R^1$ and $R^2$ may be each independently cyano group, isocyanate group, oxiranyl group, methyloxiranyl group, glycidyl group, methylglycidyl group, epoxypropyl group, oxetanyl group, oxetanemethyl group, or $C_1$-$C_{10}$ alkoxy group; Z may be —O—,

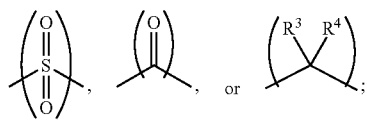

$R^3$ and $R^4$ may be each independently hydrogen, fluorine, methyl, fluoromethyl, or ethyl; and i and j may be each independently 1, 2, or 3.

According to embodiments of the disclosure, the disclosure also provides a composition (such as a solvent-free composition) exhibiting great processability and suitable for serving as liquid packaging compositions and applying in semiconductor component package. According to embodiments of the disclosure, the composition of the disclosure can include the epoxy compound having a structure represented by Formula (I) and a curing agent.

According to embodiments of the disclosure, the molar ratio of the epoxide equivalent of the epoxy compound to the mole number of the curing agent may be 1:0.7 to 1:1.3, in order to force the epoxy compound having a structure represented by Formula (I) sufficiently reacting with the curing agent. According to embodiments of the disclosure, the weight ratio of the epoxy compound to the curing agent may be about 1:9 to 9:1 (such as about 1:8, 1:7, 1:6, 1:5, 1:4, 1:3, 1:2, 1:1, 2:1, 3:1, 4:1, 5:1, 6:1, 7:1, or 8:1).

According to embodiments of the disclosure, the curing agent may be isocyanate curing agent, diamine curing agent, anhydride curing agent, phenol curing agent, organic phosphonium curing agent, thiol curing agent, or a combination thereof.

According to embodiments of the disclosure, the isocyanate curing agent may be the conventional isocyanate curing agent used in the epoxy resin composition, such as toluene diisocyanate (TDI), phenylene diisocyanate, 4,4'-diphenyl diisocyanate, naphthalene diisocyanate (NDI), diphenylmethane diisocyanate (MDI), toluidine diisocyanate (TODI), 4,4'-diphenyl ether diisocyanate, xylylene diisocyanate (XDI), tetramethyl xylylene diisocyanate (TMXDI), ω,ω'-diisocyanate-1,4-diethylbenzene, trimethylene diisocyanate, 1,2-propylene diisocyanate, butylene diisocyanate, pentamethylene diisocyanate (PDI), hexamethylene diisocyanate (HDI), trimethylhexamethylene diisocyanate, 2,6-diisocyanate methyl caprate, 1,3-cyclopentane diisocyanate, 1,3-cyclopentene diisocyanate, cyclohexane diisocyanate, isophorone diisocyanate (IPDI), methylene bis(cyclohexyl isocyanate) (H12MDI), methyl cyclohexane diisocyanate, norbornane diisocyanate (NBDI), bis(isocyanatomethyl)cyclohexane (H6XDI), or a combination thereof.

According to embodiments of the disclosure, the diamine curing agent may be the conventional diamine curing agent used in the epoxy resin composition. According to embodiments of the disclosure, the diamine curing agent may have two primary amine groups. According to embodiments of the disclosure, the diamine curing agent may be diaminodiphenyl methane, diaminodiphenyl sulfone, diaminodiphenyl ether, p-phenylenediamine, m-phenylenediamine, o-phenylenediamine, 1,3-cyclohexanebis(methylamine), 4,4'-Diaminodicyclohexyl methane, 4,4'-Methylenebis(2-methylcyclohexylamine), 4,4'-methylenebis(2-methylaniline), 4,4'-methylenebis(2-ethylaniline), 1,5-diaminonaphthalene, m-xylylenediamine, ethylenediamine, diaminopropane, diaminobutane, pentamethylene diamine, hexamethylenediamine, isophorone diamine, polyether diamine, dicyandiamide, or a combination thereof.

According to embodiments of the disclosure, when the composition of the disclosure includes the epoxy compound of the disclosure and the diamine curing agent, the cured product of the composition exhibits great thermal conductivity.

According to embodiments of the disclosure, the anhydride curing agent may be the conventional anhydride curing agent used in the epoxy resin composition, such as phthalic anhydride, trimellitic anhydride, pyromellitic anhydride, benzophenone tetracarboxylic acid anhydride, ethylene glycol trimellitic anhydride, biphenyl tetracarboxylic acid anhydride, tetrahydrophthalic anhydride, hexahydrophthalic anhydride, nadic anhydride, himic anhydride, or a combination thereof.

According to embodiments of the disclosure, the phenol curing agent may be the conventional phenol curing agent used in the epoxy resin composition, such as bisphenol A, bisphenol F, bisphenol S, 4,4'-biphenyl group 4,4'-biphenylphenol, tetramethyl bisphenol A, dimethylbisphenol A, tetramethyl bisphenol F, tetramethyl bisphenol S, dimethyl bisphenol S, tetramethyl-4,4'-biphenol, dimethyl-4,4'-biphenylphenol, 1-(4-hydroxyphenyl)-2-[4-(1,1-bis-(4-hydroxyphenyl)ethyl)phenyl]propane, 2,2'-methylene-bis(4-methyl-6-tert-butylphenol), 4,4'-butylidene-bis(3-methyl-6-tert-butylphenol), trishydroxyphenylmethane, resorcinol, hydroquinone, pyrogallol, or a combination thereof.

According to embodiments of the disclosure, the organic phosphonium curing agent may be the conventional organic phosphonium curing agent used in the epoxy resin composition, such as tetraphenylphosphonium tetra-p-tolylborate, tetraphenylphosphonium tetraphenylborate, or a combination thereof.

According to embodiments of the disclosure, the thiol curing agent may be the conventional thiol curing agent used in the epoxy resin composition, such as pentaerythritol tetrakis(3-mercaptobutyrate), trimethylolpropane tris(3-mercaptopropionate), 1,3,4-thiadiazole-2,5-dithiol, (polyethylene glycol) dithiol, toluene dithiol, benzene dithiol, 1,2-ethanedithiol, tris[2-(3-mercaptopropionyloxy)ethyl] isocyanurate, or a combination thereof.

According to embodiments of the disclosure, when the curing agent of the disclosure is replaced with an initiator (such as photo-initiator, thermal initiator, or a combination thereof), the cured product of the obtained composition would exhibit inferior thermal conductivity.

According to embodiments of the disclosure, the composition can further include an epoxy resin, wherein the weight ratio of the epoxy resin to the epoxy compound may be 1:9 to 9:1 (such as about 1:8, 1:7, 1:6, 1:5, 1:4, 1:3, 1:2, 1:1, 2:1, 3:1, 4:1, 5:1, 6:1, 7:1, or 8:1). According to embodiments of the disclosure, due to the addition of the epoxy resin, the reactivity or viscosity of the composition may be further modified, thereby increasing the processability of the composition.

According to embodiments of the disclosure, the composition of the disclosure may include the epoxy compound of the disclosure, the curing agent, and the epoxy resin. According to embodiments of the disclosure, the amount of the curing agent is not limited and may be optionally modified by a person of ordinary skill in the field, in order to sufficiently react the epoxy compound of the disclosure with the epoxy resin and the curing agent. According to embodiments of the disclosure, the composition of the disclosure may consist of the epoxy compound of the disclosure, curing agent, and epoxy resin.

According to embodiments of the disclosure, the epoxy resin may be bisphenol A epoxy resin, bisphenol F epoxy resin, bisphenol S epoxy resin, novolac epoxy resin, naphthalene epoxy resin, anthracene epoxy resin, bisphenol A diglycidyl ether epoxy resin, ethylene glycol diglycidyl ether epoxy resin, propylene glycol diglycidyl ether epoxy resin, 1,4-butanediol diglycidyl ether epoxy resin, biphenyl epoxy resin, cyclopentadiene epoxy resin, or a combination thereof.

According to embodiments of the disclosure, the composition of the disclosure can further include an additive. The additive may be conventional additives of resin composition (such as epoxy resin composition), such as leveling agent, filler, colorant, dye, defoamer, flame retardant, viscosity modifier, thixotropic agent, dispersant, stabilizer, or a combination thereof. According to embodiments of the disclosure, the amount of the additive is not limited and can be optionally modified by a person of ordinary skill in the field. The amount of the additive may be about 0.1 wt % to 30 wt % (such as about 0.2 wt %, 0.5 wt %, 0.8 wt %, 1 wt %, 1.5 wt %, 2 wt %, 2.5 wt %, 3 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, 20 wt %, 25 wt %, or 28 wt %), based on the total weight of the epoxy compound and curing agent. According to embodiments of the disclosure, since the epoxy compound of the disclosure exhibits fluidity at a low temperature (such as 25° C. to 90° C.), the composition of the disclosure (serving as packaging composition) does not include solvent and can be directly applied in packaging process.

According to embodiments of the disclosure, the disclosure also provides a cured product of the composition of the disclosure. According to embodiments of the disclosure, the cured product may be a product of the composition of the disclosure via curing process.

The method for preparing the cured product of the disclosure may include following steps. First, the composition of the disclosure is provided. Next, the composition is filled into a mold. Next, the composition in the mold is subjected to a curing process, obtaining the cured product. The curing process has a temperature of about 80° C. to 200° C. and a time period of 30 minutes to 8 hours. In addition, the curing process may include several heating stages.

Below, exemplary embodiments will be described in detail so as to be easily realized by a person having ordinary knowledge in the art. The inventive concept may be embodied in various forms without being limited to the exemplary embodiments set forth herein.

EXAMPLES

Epoxy Compound

The epoxy compound having a structure represented by Formula (I) of the disclosure includes the following compounds shown in Table 1 and the structures thereof are shown in Table 1.

TABLE 1

| | Structure |
|---|---|
| Example 1 |  |

TABLE 1-continued

| | Structure |
|---|---|
| Example 2 | Chemical structure: NC-naphthalene-O-(CH₂)₃-O-phenyl-C(CH₃)₂-phenyl-O-(CH₂)₃-O-naphthalene-CN, with glycidyl (oxiranylmethyl) groups on both central phenyl rings |
| Example 3 | Chemical structure: glycidyloxy-naphthalene-O-(CH₂)₃-O-phenyl-C(CH₃)₂-phenyl-O-(CH₂)₃-O-naphthalene-O-glycidyl, with glycidyl groups on both central phenyl rings |
| Example 4 | Chemical structure: NC-naphthalene-O-(CH₂)₁₀-O-phenyl-C(CH₃)(C₂H₅)-phenyl-O-(CH₂)₃-O-naphthalene-CN, with glycidyl groups on both central phenyl rings |
| Example 5 | Chemical structure: NC-naphthalene-O-(CH₂)₁₀-O-phenyl-CH₂-phenyl-O-(CH₂)₁₀-O-naphthalene-O-glycidyl, with glycidyl groups on both central phenyl rings |
| Example 6 | Chemical structure: glycidyl-CH₂-naphthalene-O-(CH₂)₅-O-phenyl-CF₂-phenyl-O-(CH₂)₅-O-naphthalene-CH₂-glycidyl, with glycidyl groups on both central phenyl rings |
| Example 7 | Chemical structure: glycidyloxy-naphthalene-O-(CH₂)₈-O-phenyl-C(CF₃)₂-phenyl-O-(CH₂)₈-O-naphthalene-CH₂-methylglycidyl, with glycidyl groups on both central phenyl rings |
| Example 8 | Chemical structure: OCN-naphthalene-O-(CH₂)₇-O-phenyl-SO₂-phenyl-O-(CH₂)₇-O-naphthalene-NCO, with glycidyl groups on both central phenyl rings |
| Example 9 | Chemical structure: glycidyloxy-(CN)naphthalene-O-(CH₂)₄-O-phenyl-C(CH₃)₂-phenyl-O-(CH₂)₄-O-(CN)naphthalene-O-glycidyl, with glycidyl groups on both central phenyl rings |
| Example 10 | Chemical structure: glycidyl-CH₂-naphthalene-O-(CH₂)₉-O-phenyl-C(CH₃)₂-phenyl-O-(CH₂)₉-O-naphthalene-CH₂-glycidyl, with glycidyl groups on both central phenyl rings |

In order to clearly illustrate the method for preparing the epoxy compound of the disclosure, the preparation of compounds disclosed in Examples 1-3 are described in detail below.

Example 1: Epoxy Compound (1)

1,6-dibromohexane (86.5 g), sodium hydroxide (NaOH) (10 g), and acetone (400 ml) were disposed in a reaction bottle. Next, 6-cyano-2-naphthol (20 g) was dissolved in acetone (100 ml), obtaining a 6-cyano-2-naphthol solution. Next, the 6-cyano-2-naphthol solution was dropwisely added to the reaction bottle (completed within 3 hours). After reacting at 25° C. for 8 hours, the result was filtrated, and the filtrate was collected. After subjecting the filtrate to a concentration, the result was dropwisely added into methanol, and then a precipitate was formed. The precipitate was collected and dried, obtaining Compound (1) (white solid). The synthesis pathway of the above reaction was as follows:

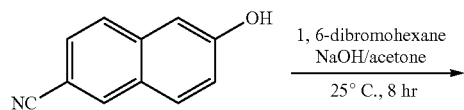

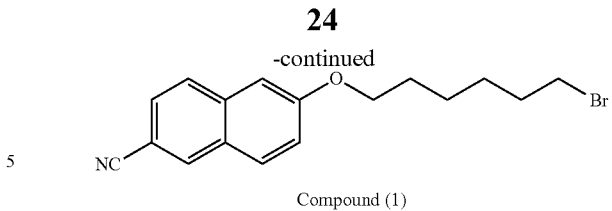

Compound (1)

The measurement results of nuclear magnetic resonance spectrometry of Compound (1) are shown below. $^1$H-NMR (500 MHz, CDCl$_3$): δ1.50-2.00 (m, 4H), 1.80-2.00 (m, 4H), 3.43 (br.t, 2H), 4.10 (br.t, 2H), 7.15 (s, 1H), 7.20-6.25 (m, 1H), 7.58 (b, 1H), 7.75-7.80 (m, 2H), 8.15 (s, 1H).

2,2'-diallylbisphenol A (8.46 g) and acetone (600 ml) were added into a reaction bottle. Next, sodium hydroxide (NaOH) (10 g) was added into the reaction bottle. After stirring for half an hour, Compound (1) (15.5 g) was added into the reaction bottle and the result was stirred at 25° C. The conversion of Compound (1) was monitored via nuclear magnetic resonance spectrometry. When the conversion exceeded 97%, the reaction was stopped. Next, the result was filtrated, and the filtrate was collected. After subjecting the filtrate to a concentration, the result was added into dichloromethane and extracted three times using water as the extraction solvent, and then the organic phase was collected. Next, the organic phase was dehydrated by sulfuric acid magnesium and then concentrated, obtaining Compound (2) (viscous liquid). The synthesis pathway of the above reaction was as follows:

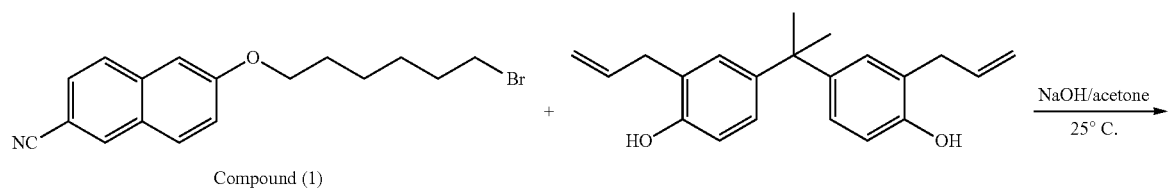

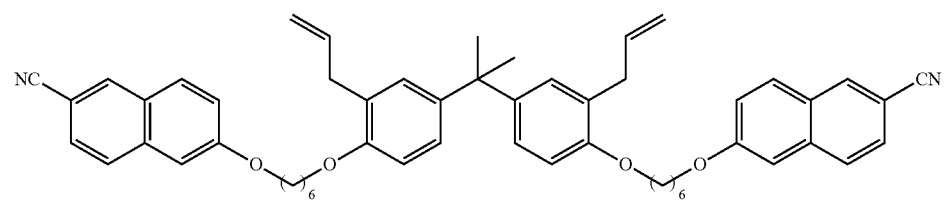

Compound (2)

The measurement results of nuclear magnetic resonance spectrometry of Compound (2) are shown below. $^1$H-NMR (500 MHz, CDCl$_3$): δ1.50-1.70 (m, 14H), 1.80-2.00 (m, 8H), 3.33 (br.d, 4H), 3.95 (br.t, 4H), 4.10 (br.t, 4H), 4.95-5.05 (m, 4H), 5.85-6.00 (m, 2H), 6.70-7.80 (m, 2H), 6.95-7.05 (m, 4H), 7.15 (s, 2H), 7.20-6.25 (m, 2H), 7.58 (br.d, 2H), 7.75-7.80 (m, 4H), 8.15 (s, 2H).

Compound (2) (17 g) and dichloromethane (100 g) were added into a reaction bottle. 3-chloroperoxybenzoic acid (m-CPBA) (70%, 20 g) was slowly added into the reaction bottle at 0° C. Next, the result was stirred at 25° C., and the conversion of Compound (2) was monitored via nuclear magnetic resonance spectrometry. When the conversion exceeded 97%, the reaction was stopped. A saturated sodium hydrogen carbonate (NaHCO$_3$) aqueous solution (100 ml) sodium hydrogen carbonate (NaHCO$_3$) aqueous solution (100 ml) was added into the reaction bottle, and the organic phase was collected and extracted three times using water as the extraction solvent. Next, the organic phase was dehydrated by sulfuric acid magnesium and then concentrated, obtaining Epoxy Compound (1) (brown product). The synthesis pathway of the above reaction was as follows:

at 25° C. for 8 hours, the result was filtrated, and the filtrate was collected. After subjecting the filtrate to a concentration, the result was dropwisely added into methanol, and then a precipitate was formed. The precipitate was collected and dried, obtaining Compound (3) (white solid). The synthesis pathway of the above reaction was as follows:

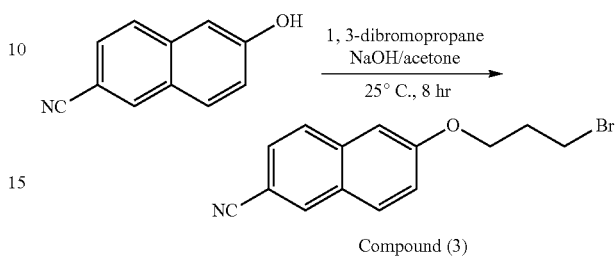

Compound (3)

The measurement results of nuclear magnetic resonance spectrometry of Compound (3) are shown below. $^1$H-NMR (500 MHz, CDCl$_3$): δ2.30-2.40 (m, 2H), 3.63 (br.t, 2H), 4.26

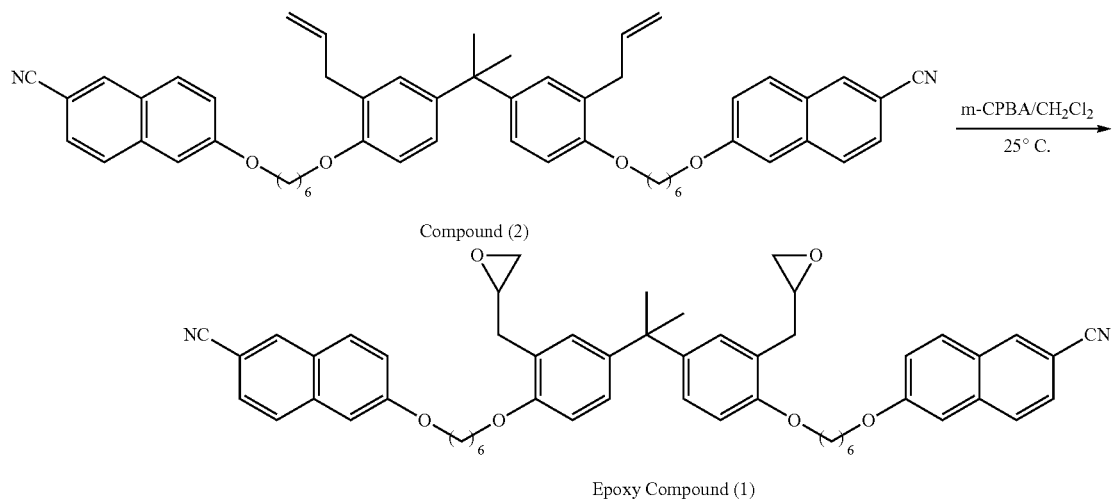

Epoxy Compound (1)

The measurement results of nuclear magnetic resonance spectrometry of Epoxy Compound (1) are shown below. $^1$H-NMR (500 MHz, CDCl$_3$): δ1.50-1.70 (m, 14H), 1.80-2.00 (m, 8H), 2.50-2.55 (m, 2H), 2.60-2.80 (m, 4H), 2.85-3.00 (m, 2H), 3.15 (br.s, 2H), 3.95 (br.t, 4H), 4.10 (br.t, 4H), 6.70-7.80 (m, 2H), 6.95-7.05 (m, 4H), 7.15 (s, 2H), 7.20-6.25 (m, 2H), 7.58 (br.d, 2H), 7.75-7.80 (m, 4H), 8.15 (s, 2H).

The viscosity of Epoxy Compound (1) was measured. The viscosity of Epoxy Compound (1) at 50° C. was 26.4 Pa·s, and the viscosity of Epoxy Compound (1) at 90° C. was 2.54 Pa·s. The viscosity was measured by high-shear cone & plate viscometer (Brookfield CAP2000 H).

Example 2: Epoxy Compound (2)

1,3-dibromopropane (71.6 g), sodium hydroxide (NaOH) (10 g), and acetone (400 ml) were disposed in a reaction bottle. Next, 6-cyano-2-naphthol (20 g) was dissolved in acetone (100 ml), obtaining a 6-cyano-2-naphthol solution. Next, 6-cyano-2-naphthol solution was dropwisely added to the reaction bottle (completed within 3 hours). After reacting (br.t, 2H), 7.18 (s, 1H), 7.20-6.25 (m, 1H), 7.58 (m, 1H), 7.75-7.80 (m, 2H), 8.15 (s, 1H).

2,2'-diallylbisphenol A (9.72 g) and acetone (600 ml) were added into a reaction bottle. Next, sodium hydroxide (NaOH) (15 g) was added into the reaction bottle. After stirring for half an hour, Compound (3) (16.4 g) was added into the reaction bottle, and the result was stirred at 25° C. The conversion of Compound (3) was monitored via nuclear magnetic resonance spectrometry. When the conversion exceeded 97%, the reaction was stopped. Next, the result was filtrated, and the filtrate was collected. After subjecting the filtrate to a concentration, the result was added into dichloromethane and extracted three times using water as the extraction solvent, and then the organic phase was collected. Next, the organic phase was dehydrated by sulfuric acid magnesium and then concentrated, obtaining Compound (4) (viscous liquid). The synthesis pathway of the above reaction was as follows:

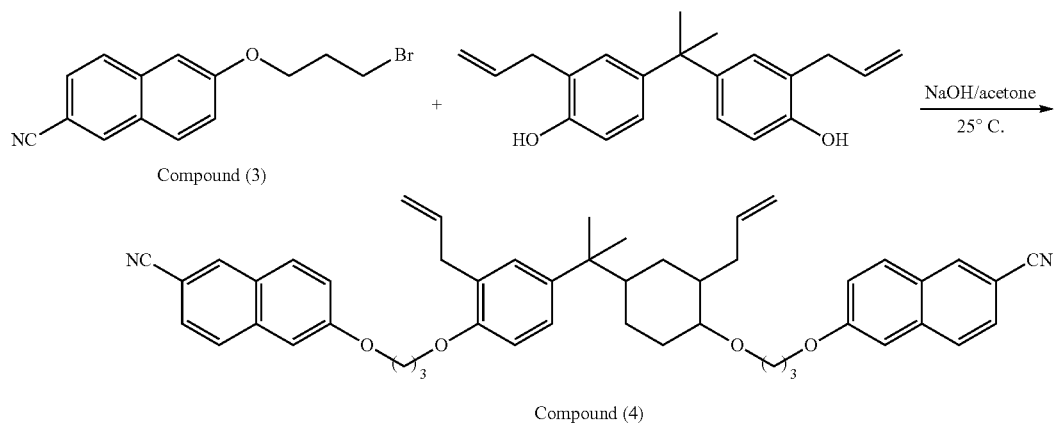

The measurement results of nuclear magnetic resonance spectrometry of Compound (4) are shown below. $^1$H-NMR (500 MHz, CDCl$_3$): δ1.60 (br.s, 6H), 2.30-2.40 (m, 4H), 3.33 (br.d, 4H), 4.18 (br.t, 4H), 4.37 (br.t, 4H), 4.90-5.00 (m, 4H), 5.85-6.00 (m, 2H), 6.70-7.80 (m, 2H), 6.95-7.05 (m, 4H), 7.18 (s, 2H), 7.20-6.25 (m, 2H), 7.58 (br.d, 2H), 7.75-7.80 (m, 4H), 8.15 (s, 2H).

Compound (4) (21.7 g) and dichloromethane (110 g) were added into a reaction bottle. 3-chloroperoxybenzoic acid (m-CPBA) (70%, 37 g) was slowly added into the reaction bottle at 0° C. Next, the result was stirred at 25° C., and the conversion of Compound (4) was monitored via nuclear magnetic resonance spectrometry. When the conversion exceeded 97%, the reaction was stopped. A saturated sodium hydrogen carbonate (NaHCO$_3$) aqueous solution (100 ml) sodium hydrogen carbonate (NaHCO$_3$) aqueous solution (100 ml) was added into the reaction bottle, and the organic phase was collected and extracted three times using water as the extraction solvent. Next, the organic phase was dehydrated by sulfuric acid magnesium and then concentrated, obtaining Epoxy Compound (2) (brown product). The synthesis pathway of the above reaction was as follows:

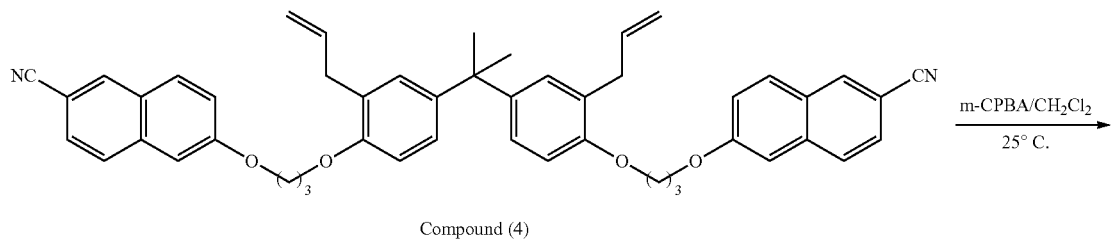

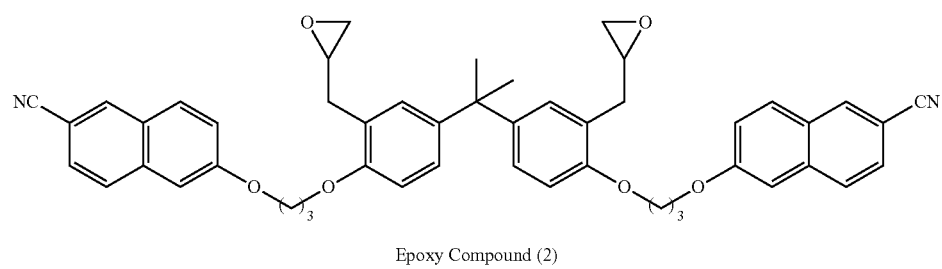

The measurement results of nuclear magnetic resonance spectrometry of Epoxy Compound (2) are shown below. $^1$H-NMR (500 MHz, CDCl$_3$): δ1.60 (br.s, 6H), 2.30-2.40 (m, 4H), 2.40-2.50 (m, 2H), 2.60-3.00 (m, 6H), 3.15 (br.s, 2H), 4.18 (br.t, 4H), 4.37 (br.t, 4H), 6.70-7.80 (m, 2H), 6.95-7.05 (m, 4H), 7.18 (s, 2H), 7.20-6.25 (m, 2H), 7.58 (br.d, 2H), 7.75-7.80 (m, 4H), 8.15 (s, 2H).

The viscosity of Epoxy Compound (2) was measured. The viscosity of Epoxy Compound (2) at 90° C. was 18.2 Pa·s.

Example 3: Epoxy Compound (3)

2,7-dihydroxynaphthalene (20 g), sodium hydroxide (4.7 g), and acetone (300 ml) were added into a reaction bottle. Next, allyl bromide (14 g) was added into the reaction bottle. After reacting at 25° C. for 8 hours, the result was filtrated, and the filtrate was collected. After subjecting the filtrate to a concentration, the result was dropwisely added into dichloromethane. The result was filtrated, The filtrate was collected and then concentrated, obtaining Compound (5). The synthesis pathway of the above reaction was as follows:

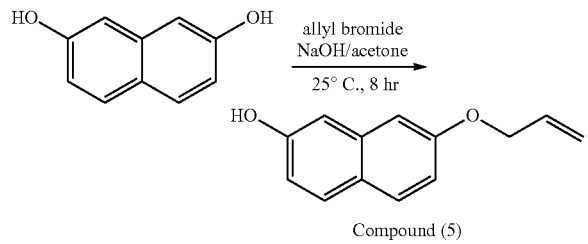

Compound (5)

The measurement results of nuclear magnetic resonance spectrometry of Compound (5) are shown below. $^1$H-NMR (500 MHz, CDCl$_3$): δ4.60-4.70 (br.d, 2H), 5.34 (br.d, 1H), 5.48 (br.d, 1H), 6.08-6.20 (m, 1H), 6.90-7.10 (m, 4H), 7.60-7.70 (m, 2H).

1,3-dibromopropane (55 g), sodium hydroxide (10 g), and acetone (400 ml) were disposed in a reaction bottle. Next, Compound (5) (15.7 g) was dissolved in acetone (100 ml), obtaining a solution. Next, the solution was dropwisely added to the reaction bottle (completed within 3 hours). After reacting at 25° C. for 8 hours, the result was filtrated, and the filtrate was collected. After subjecting the filtrate to a concentration, the result was dropwisely added into methanol, and then a precipitate was formed. The precipitate was collected and dried, obtaining Compound (6). The synthesis pathway of the above reaction was as follows:

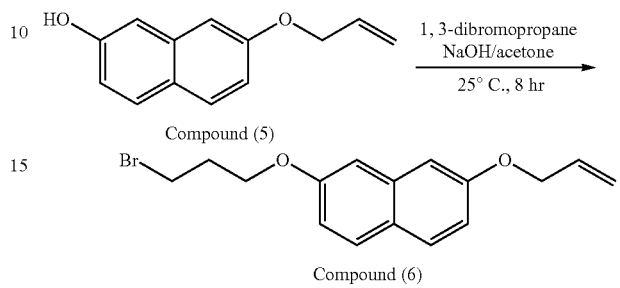

Compound (6)

The measurement results of nuclear magnetic resonance spectrometry of Compound (6) are shown below. $^1$H-NMR (500 MHz, CDCl$_3$): δ2.30-2.45 (m, 2H), 3.63 (br.t, 2H), 4.20 (br.t, 2H), 4.60-4.70 (br.d, 2H), 5.34 (br.d, 1H), 5.48 (br.d, 1H), 6.08-6.20 (m, 1H), 6.90-7.10 (m, 4H), 7.60-7.70 (m, 2H).

2,2'-diallylbisphenol A (7.72 g), and acetone (600 ml) were added into a reaction bottle. Next, sodium hydroxide (6.5 g) was added into the reaction bottle. After stirring for half an hour, Compound (6) (18.1 g) was added into the reaction bottle, and the result was stirred at 25° C. The conversion of Compound (6) was monitored via nuclear magnetic resonance spectrometry. When the conversion exceeded 97%, the reaction was stopped. Next, the result was filtrated, and the filtrate was collected. After subjecting the filtrate to a concentration, the result was added into dichloromethane and extracted three times using water as the extraction solvent, and then the organic phase was collected. Next, the organic phase was dehydrated by sulfuric acid magnesium and then concentrated, obtaining Compound (7). The synthesis pathway of the above reaction was as follows:

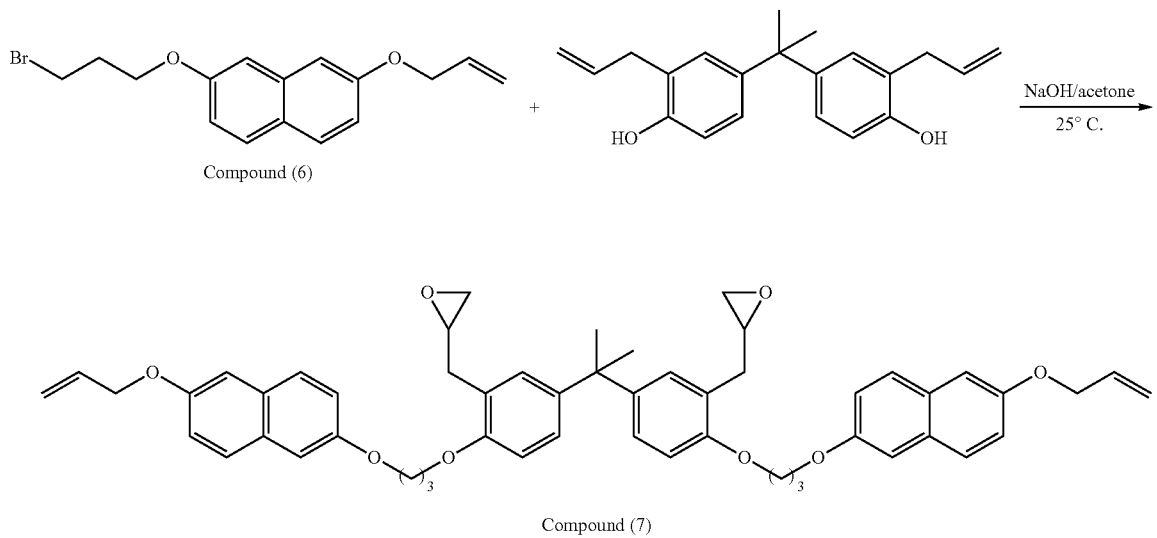

Compound (7)

The measurement results of nuclear magnetic resonance spectrometry of Compound (7) are shown below. $^1$H-NMR (500 MHz, CDCl$_3$): δ1.60 (br.s, 6H), 2.30-2.40 (m, 4H), 3.33 (br.d, 4H), 4.18 (br.t, 4H), 4.37 (br.t, 4H), 4.60-4.70 (br.d, 4H), 5.90-5.10 (m, 4H), 5.34 (br.d, 2H), 5.48 (br.d, 2H), 5.85-6.10 (m, 2H), 6.10-6.20 (m, 2H), 6.70-7.80 (m, 2H), 6.90-7.20 (m, 12H), 7.60-7.70 (m, 4H).

Compound (7) (5 g) and dichloromethane (100 g) were added into a reaction bottle. 3-chloroperoxybenzoic acid (m-CPBA) (70%, 12.5 g) was slowly added into the reaction bottle at 0° C. Next, the result was stirred at 25° C., and the conversion of Compound (7) was monitored via nuclear magnetic resonance spectrometry. When the conversion exceeded 97%, the reaction was stopped. Next, a saturated sodium hydrogen carbonate (NaHCO$_3$) aqueous solution (100 ml) sodium hydrogen carbonate aqueous solution (100 ml) was added into the reaction bottle, and the organic phase was collected and extracted three times using water as the extraction solvent. Next, the organic phase was dehydrated by sulfuric acid magnesium and then concentrated, obtaining Epoxy Compound (3) (brown product). The synthesis pathway of the above reaction was as follows:

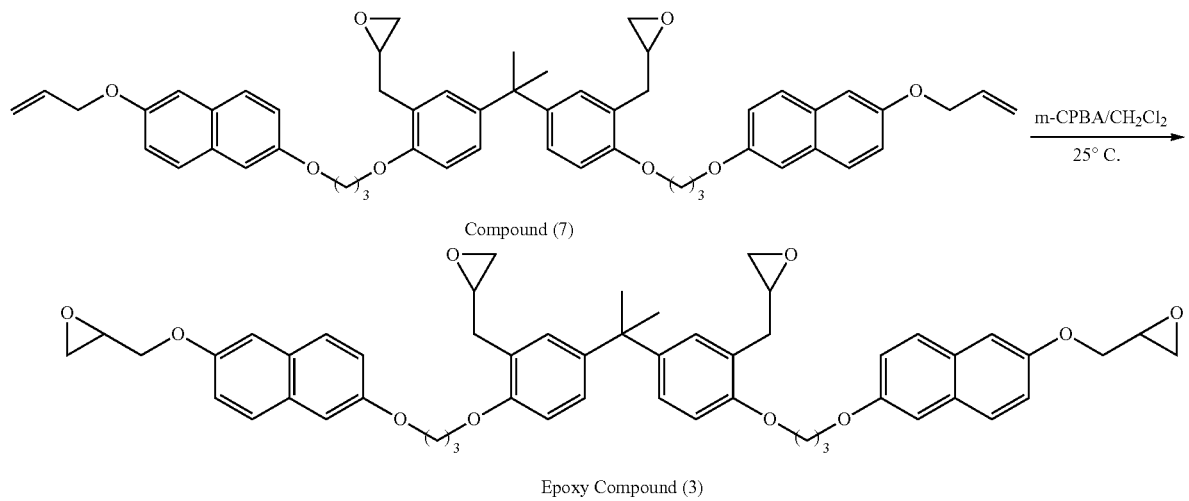

The measurement results of nuclear magnetic resonance spectrometry of Epoxy Compound (3) are shown below. $^1$H-NMR (500 MHz, CDCl$_3$): δ1.60 (br.s, 6H), 2.30-2.40 (m, 4H), 2.40-3.20 (m, 20H), 3.85 (br.t, 4H), 4.08 (br.t, 4H), 6.70-7.80 (m, 2H), 6.90-7.20 (m, 12H), 7.60-7.70 (m, 4H).

The viscosity of Epoxy Compound (3) was measured. The viscosity of Epoxy Compound (3) at 90° C. was 105.9 Pa·s.

As shown in Examples 1-3, the epoxy compounds of the disclosure exhibits lower viscosity at 90° C. and superior fluidity.

Composition

Example 11

8.46 parts by weight of Bisphenol F epoxy resin (commercially available from DIC with a trade number of EXA-830LVP), 6 parts by weight of epoxy compound (1), and 4.66 parts by weight of 4,4'-methylenebis(2-methylaniline) (serving as curing agent) were mixed, obtaining Composition (1).

Example 12

8.46 parts by weight of Bisphenol F epoxy resin (commercially available from DIC with a trade number of EXA-830LVP), 6 parts by weight of epoxy compound (1), and 1.89 parts by weight of 1,5-diaminopentane (serving as curing agent) were mixed, obtaining Composition (2).

Example 13

9.04 parts by weight of Bisphenol F epoxy resin (commercially available from DIC with a trade number of EXA-830LVP), 6 parts by weight of epoxy compound (2), and 4.98 parts by weight of 4,4'-methylenebis(2-methylaniline) (serving as curing agent) were mixed, obtaining Composition (3).

Example 14

9.04 parts by weight of Bisphenol F epoxy resin (commercially available from DIC with a trade number of EXA-830LVP), 6 parts by weight of epoxy compound (1), and 2.02 parts by weight of 1,5-diaminopentane (serving as curing agent) were mixed, obtaining Composition (4).

Example 15

8.05 parts by weight of Bisphenol F epoxy resin (commercially available from DIC with a trade number of EXA-830LVP), 3 parts by weight of epoxy compound (3), and 4.43 parts by weight of 4,4'-methylenebis(2-methylaniline) (serving as curing agent) were mixed, obtaining Composition (5).

Example 16

9.04 parts by weight of Bisphenol F epoxy resin (commercially available from DIC with a trade number of EXA-830LVP), 3 parts by weight of epoxy compound (3), and 1.80 parts by weight of 1,5-diaminopentane (serving as curing agent) were mixed, obtaining Composition (6).

Comparative Example 1

7.1 parts by weight of Bisphenol F epoxy resin (commercially available from DIC with a trade number of EXA- 830LVP), and 3.15 parts by weight of 4,4'-methylenebis(2-methylaniline) (serving as curing agent) were mixed, obtaining Composition (7).

Comparative Example 2

8.46 parts by weight of Bisphenol F epoxy resin (commercially available from DIC with a trade number of EXA-830LVP), 6 parts by weight of epoxy compound (1), and 0.145 parts by weight of 1-methylimidazole (serving as initiator) were mixed, obtaining Composition (8).

The heat release rate curves of Compositions (1), (3), (5) and (7) were measured by differential scanning calorimeter (DSC 7, Perkin Elmer) at a heating rate of 10° C./minute, and the exothermic peak temperature of the epoxy compositions was determined. The results are shown in Table 2.

TABLE 2

|  | DSC exothermic peak temperature (° C.) |
| --- | --- |
| Composition (1) | 170 |
| Composition (3) | 160 |
| Composition (5) | 168 |
| Composition (7) | 180 |

As shown in Table 2, due to the epoxy compound of the disclosure, the curing temperature of the composition of the disclosure is reduced, resulting in that the composition of the disclosure is cured by a curing process with a relatively lower process temperature.

Properties Measurement of Cured Product

Compositions (1), (3), (5), and (7) were filled into the molds (30 mm×30 mm) respectively. Next, the compositions were cured at 100° C. for 1 hour, at 130° C. for 3 hours, and at 160° C. for 3 hours, obtaining the cured products of Compositions (1), (3), (5), and (7).

Compositions (2), (4) and (6) were filled into the molds (30 mm×30 mm) respectively. Next, the composition compositions were cured at 70° C. for 3 hours and at 110° C. for 2 hours, obtaining the cured products of Compositions (2), (4) and (6).

Composition (8) was filled into the mold (30 mm×30 mm). Next, the composition was cured at 100° C. for 1 hour, at 140° C. for 4 hours, and at 180° C. for 3 hours, obtaining the cured product of Composition (8).

Next, the thermal conductivity of the cured products of Compositions (1)-(8) was measured, and the results are shown in Table 3. The thermal conductivity is determined by laser flash method thermal-constant measuring system (TC-7000, Ulvac-Rico) according to ASTM-E1461.

TABLE 3

|  | thermal conductivity (W/m · K) |
| --- | --- |
| cured product of Composition (1) | 0.30 |
| cured product of Composition (2) | 0.29 |
| cured product of Composition (3) | 0.29 |
| cured product of Composition (4) | 0.28 |
| cured product of Composition (5) | 0.31 |
| cured product of Composition (6) | 0.27 |
| cured product of Composition (7) | 0.19 |
| cured product of Composition (8) | 0.19 |

As shown in Table 3, due to the epoxy compound of the disclosure, the thermal conductivity of the cured product of composition of the disclosure is increased.

Accordingly, due to the introduction of the epoxy compound with a specific structure of the disclosure, the composition of the disclosure exhibits lower temperature and higher processability. In addition, the composition of the disclosure can serve as liquid packaging materials. Further, the cured product of the composition of the disclosure exhibits higher thermal conductivity and meets the characteristic requirements on conductive packaging materials.

It will be clear that various modifications and variations can be made to the disclosed methods and materials. It is intended that the specification and examples be considered as exemplary only, with the true scope of the disclosure being indicated by the following claims and their equivalents.

What is claimed is:

1. An epoxy compound, having a structure represented by Formula (I)

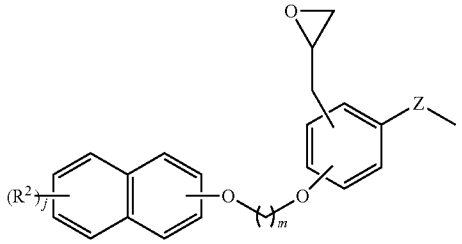

Formula (I)

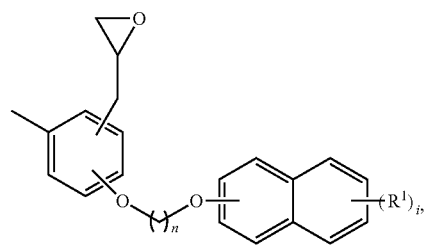

wherein $R^1$ and $R^2$ are independently cyano group, isocyanate group, oxiranyl group, methyloxiranyl group, glycidyl group, methylglycidyl group, epoxypropyl group, oxetanyl group, oxetanemethyl group, or $C_1$-$C_{10}$ alkoxy group; Z is —O—,

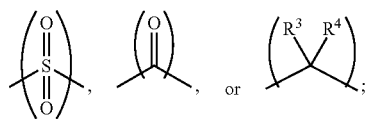

$R^3$ and $R^4$ are independently hydrogen, fluorine, methyl, fluoromethyl, or ethyl; n and m are independently 3, 4, 5, 6, 7, 8, 9, or 10; and i and j are independently 1, 2, or 3.

2. The epoxy compound as claimed in claim 1, wherein the epoxy compound is
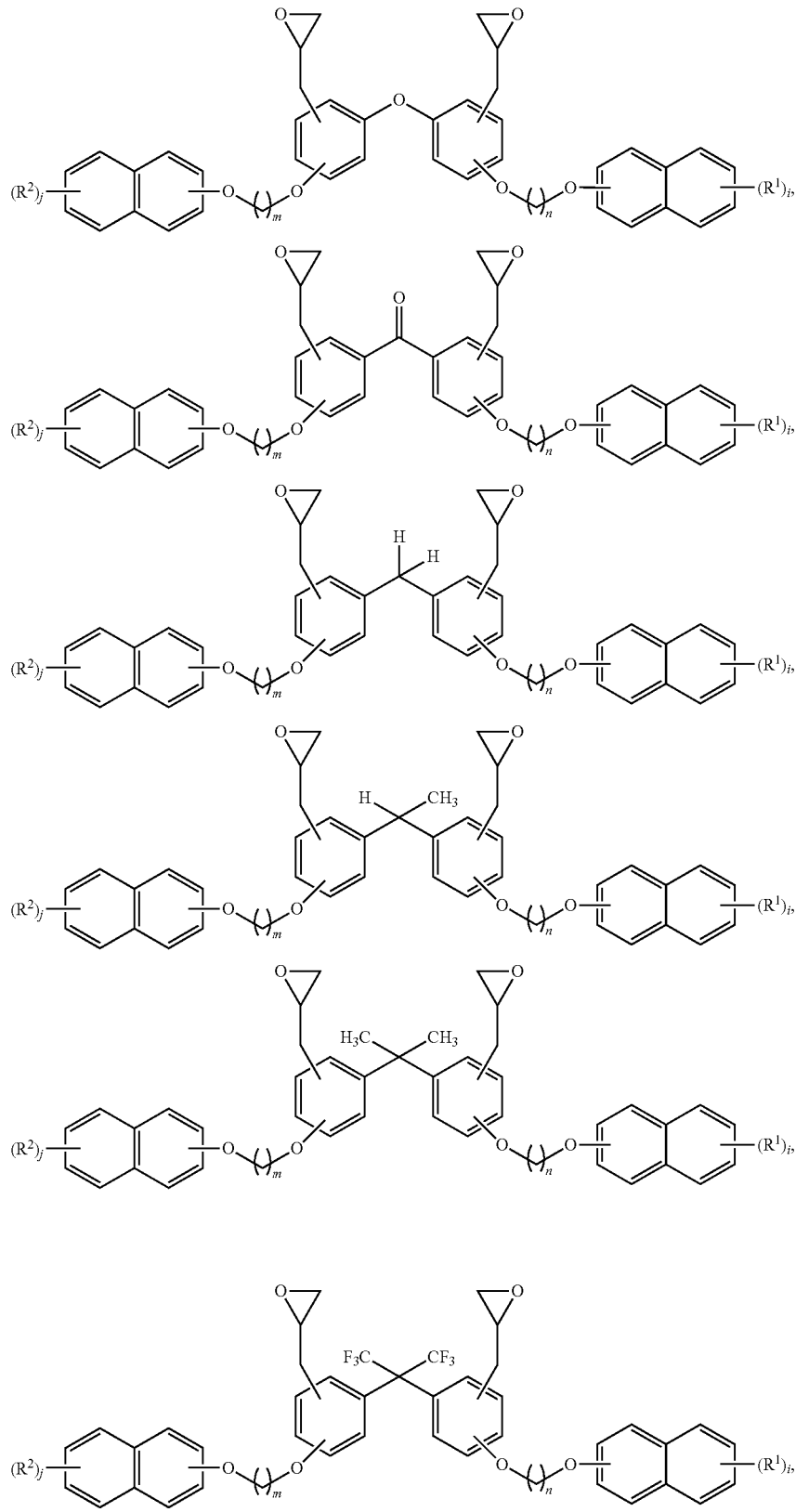

-continued

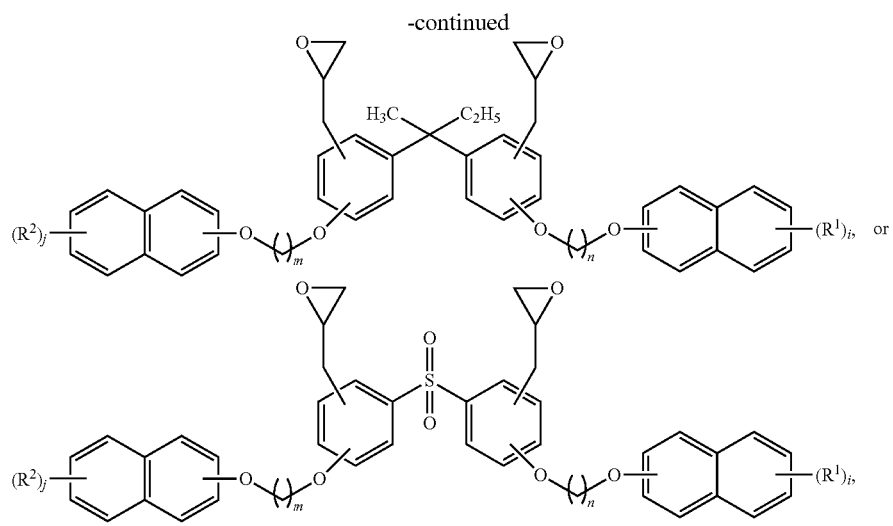

wherein R¹ and R² are independently cyano group, isocyanate group, oxiranyl group, methyloxiranyl group, glycidyl group, methylglycidyl group, epoxypropyl group, oxetanyl group, oxetanemethyl group, or $C_1$-$C_{10}$ alkoxy group; and n and m are independently 3, 4, 5, 6, 7, 8, 9, or 10; and i and j are independently 1, 2, or 3.

3. The epoxy compound as claimed in claim 1, wherein the epoxy compound is

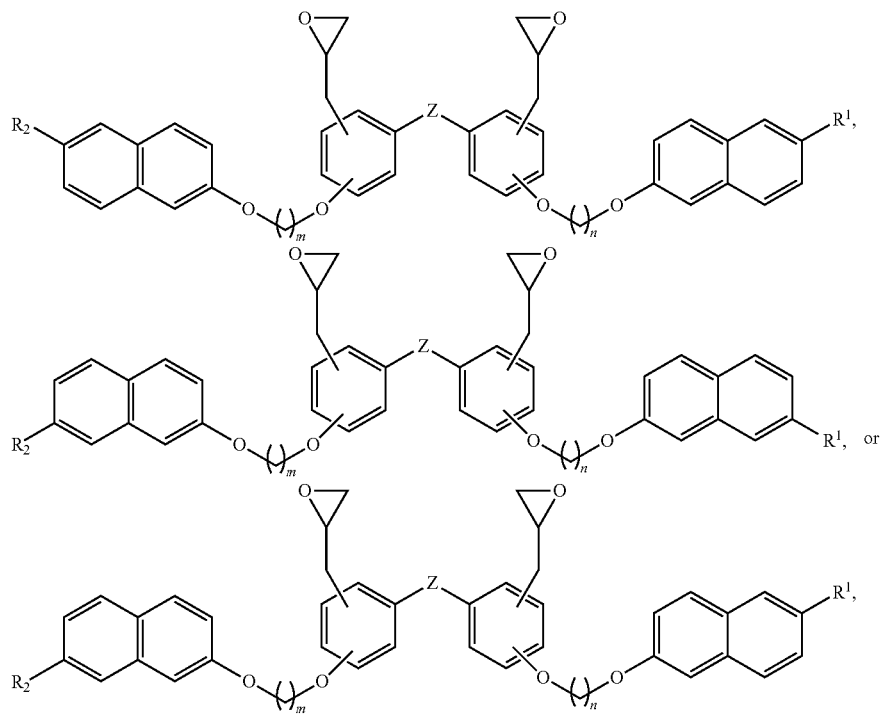

wherein R¹ and R² are independently cyano group, isocyanate group, oxiranyl group, methyloxiranyl group, glycidyl group, methylglycidyl group, epoxypropyl group, oxetanyl group, oxetanemethyl group, or $C_1$-$C_{10}$ alkoxy group; Z is —O—,

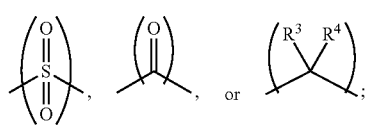
$R^3$ and $R^4$ are independently hydrogen, fluorine, methyl, fluoromethyl, or ethyl; and n and m are independently 3, 4, 5, 6, 7, 8, 9, or 10.
4. The epoxy compound as claimed in claim 1, wherein the epoxy compound is
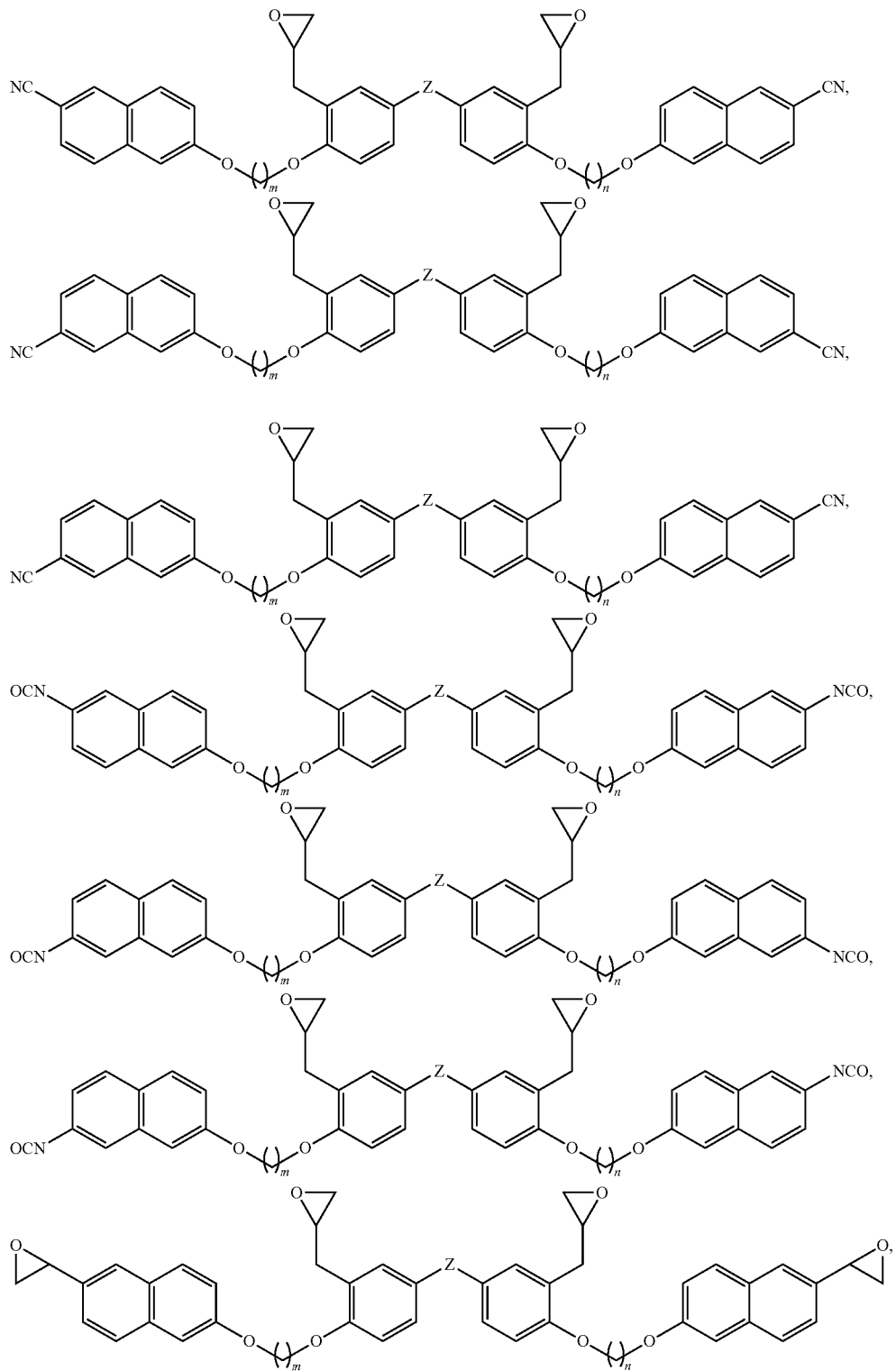

-continued
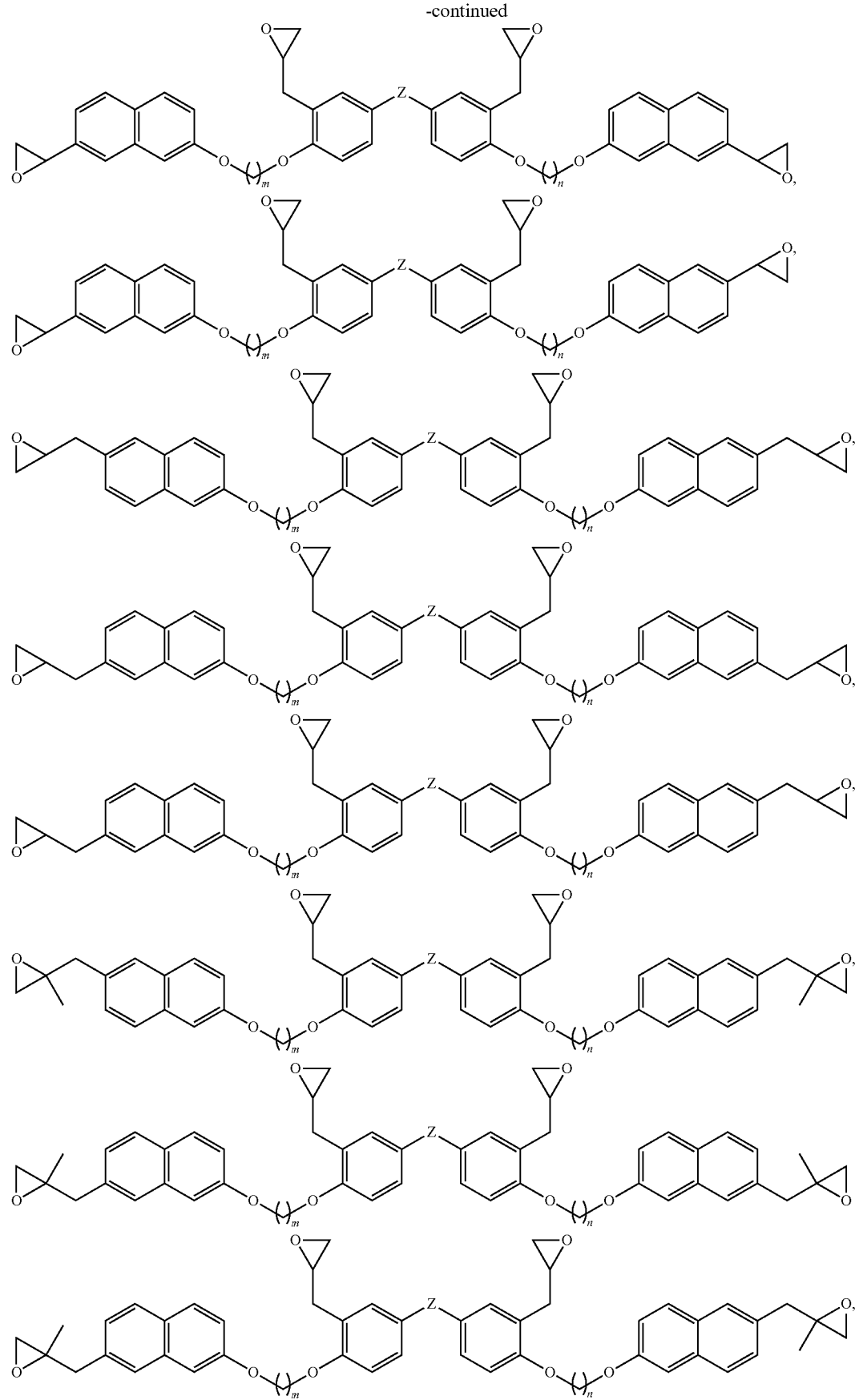

-continued
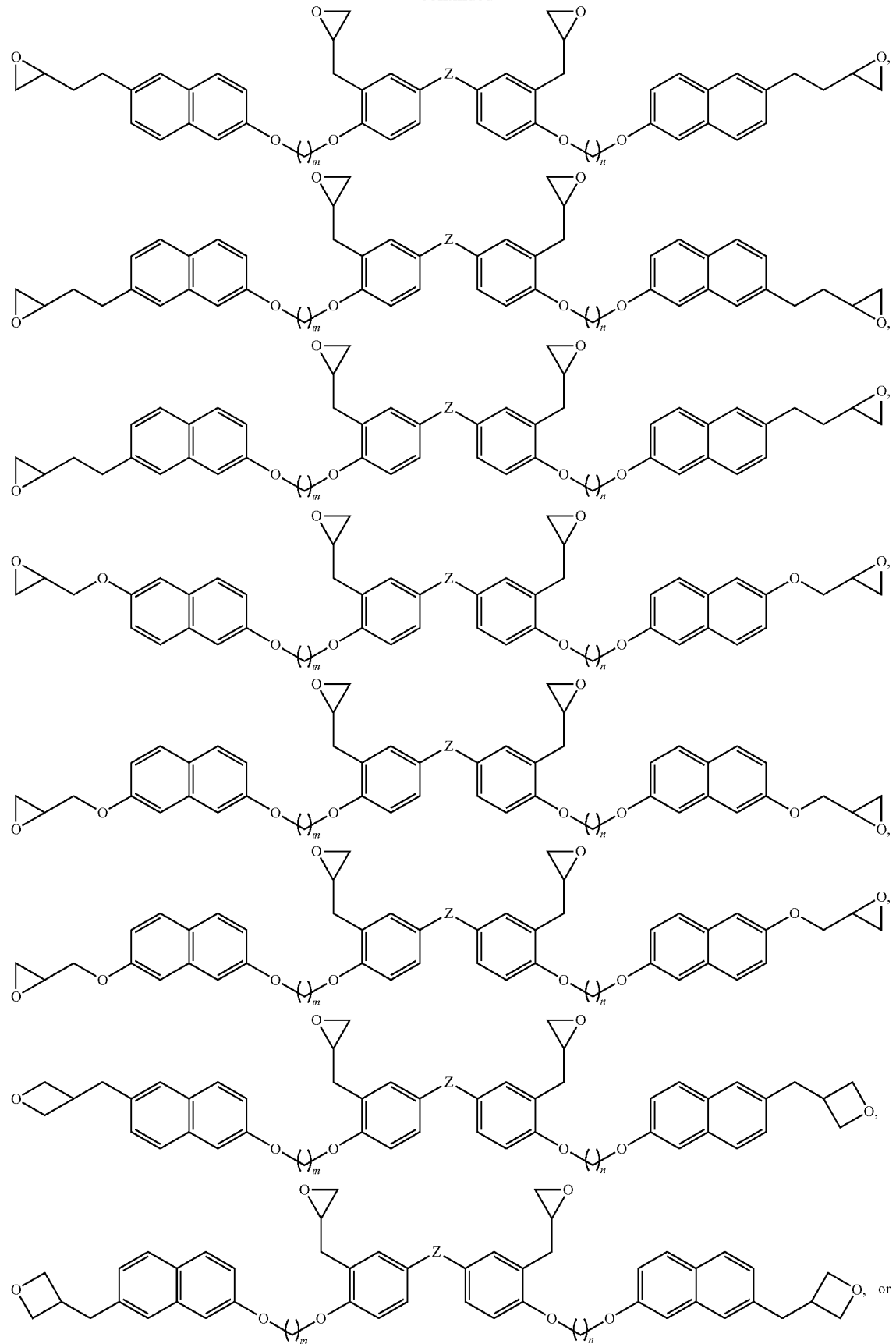

-continued
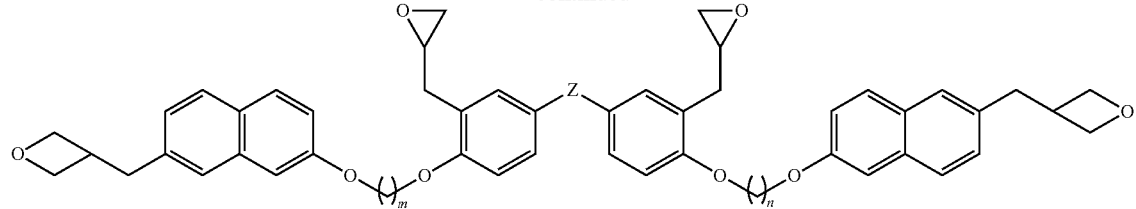
wherein Z is —O—,
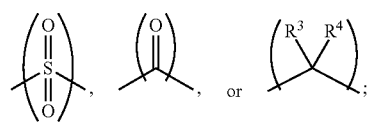
$R^3$ and $R^4$ are independently hydrogen, fluorine, methyl, fluoromethyl, or ethyl; and n and m are independently 3, 4, 5, 6, 7, 8, 9, or 10.
5. The epoxy compound as claimed in claim 1, wherein the epoxy compound is
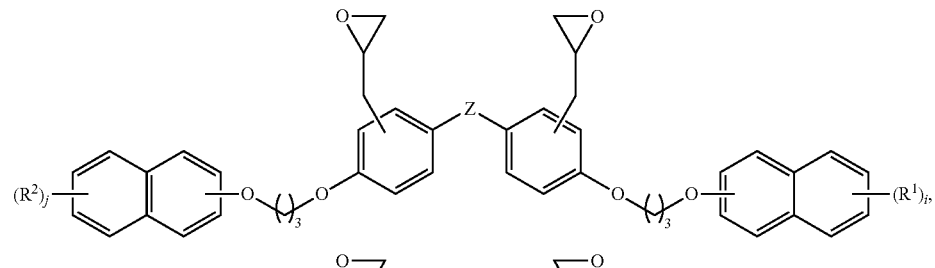
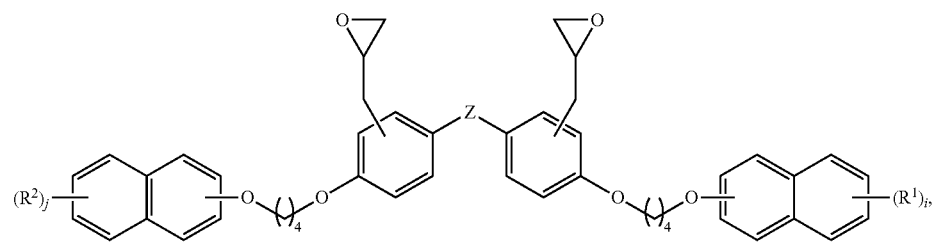
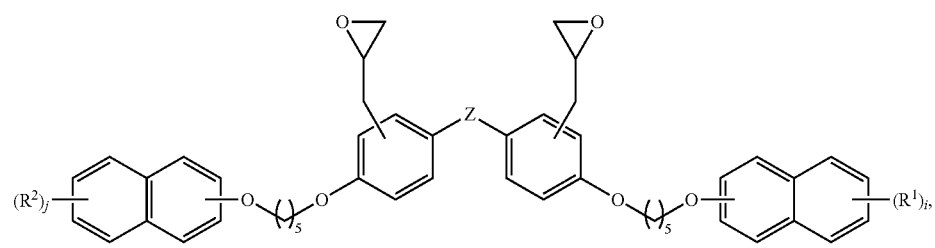
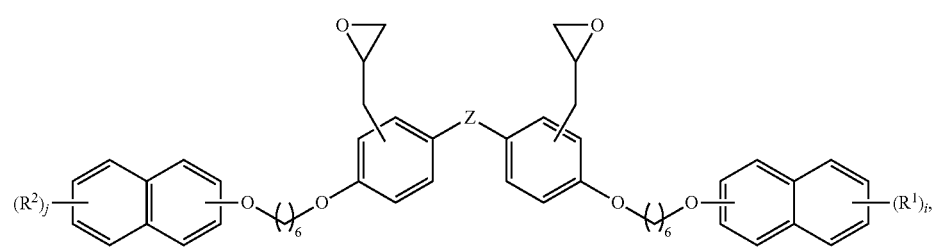

-continued

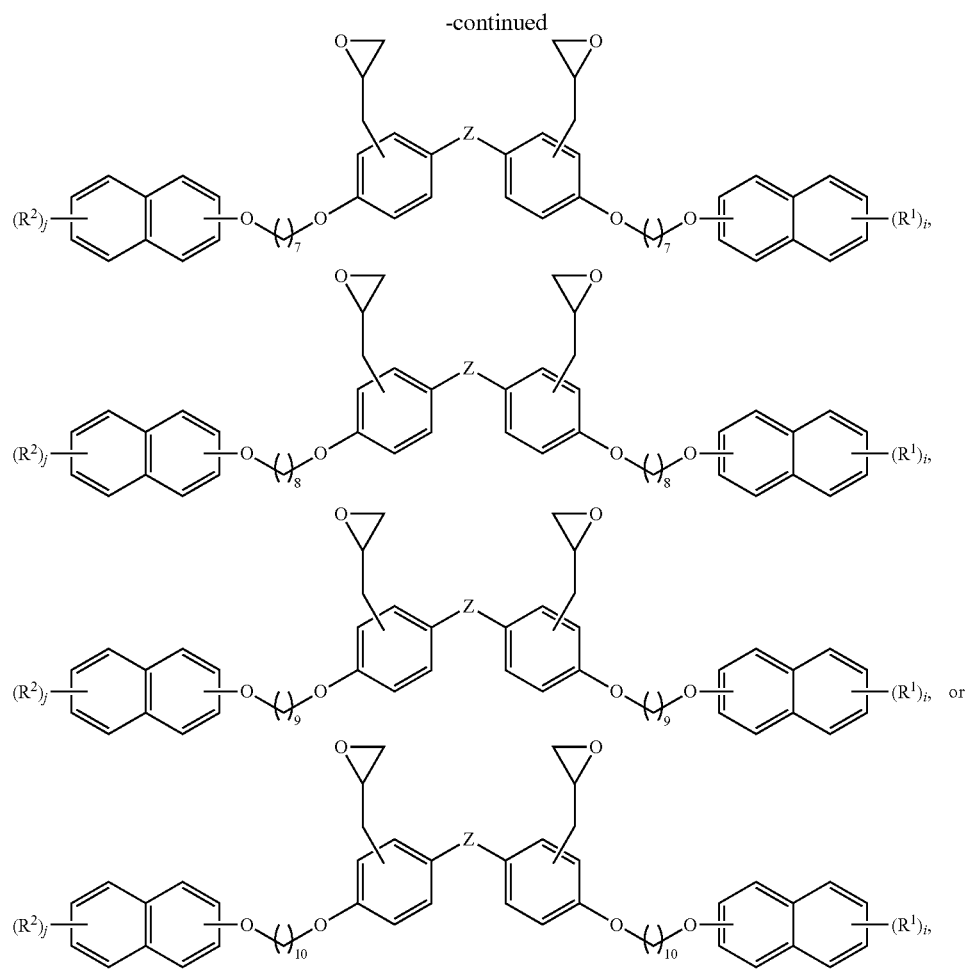

wherein $R^1$ and $R^2$ are independently cyano group, isocyanate group, oxiranyl group, methyloxiranyl group, glycidyl group, methylglycidyl group, epoxypropyl group, oxetanyl group, oxetanemethyl group, or $C_1$-$C_{10}$ alkoxy group; Z is —O—,

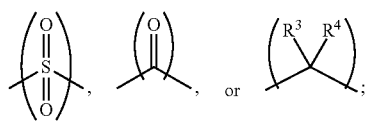

$R^3$ and $R^4$ are independently hydrogen, fluorine, methyl, fluoromethyl, or ethyl; and i and j are independently 1, 2, or 3.

6. A composition, comprising:
the epoxy compound as claimed in claim 1; and
a curing agent, wherein the weight ratio of the epoxy compound to the curing agent is 1:9 to 9:1.

7. The composition as claimed in claim 6, wherein the curing agent is isocyanate curing agent, diamine curing agent, anhydride curing agent, phenol curing agent, organic phosphonium curing agent, thiol curing agent, or a combination thereof.

8. The composition as claimed in claim 6, further comprising:
an epoxy resin, wherein the weight ratio of the epoxy resin to the epoxy compound is 1:9 to 9:1.

9. The composition as claimed in claim 6, wherein the epoxy resin is bisphenol A epoxy resin, bisphenol F epoxy resin, bisphenol S epoxy resin, novolac epoxy resin, naphthalene epoxy resin, anthracene epoxy resin, bisphenol A diglycidyl ether epoxy resin, ethylene glycol diglycidyl ether epoxy resin, propylene glycol diglycidyl ether epoxy resin, 1,4-butanediol diglycidyl ether epoxy resin, biphenyl epoxy resin, cyclopentadiene epoxy resin, or a combination thereof.

10. A cured product, which is a product of the composition as claimed in claim 6 via curing.

* * * * *